US011152532B2

(12) United States Patent
Nagumo et al.

(10) Patent No.: US 11,152,532 B2
(45) Date of Patent: Oct. 19, 2021

(54) METHOD OF MANUFACTURING DRIVEN ELEMENT CHIP, DRIVEN ELEMENT CHIP, EXPOSING DEVICE, AND IMAGE FORMING APPARATUS

(71) Applicant: Oki Data Corporation, Tokyo (JP)

(72) Inventors: Akira Nagumo, Tokyo (JP); Shinya Jumonji, Tokyo (JP); Minoru Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 191 days.

(21) Appl. No.: 16/039,417

(22) Filed: Jul. 19, 2018

(65) Prior Publication Data

US 2019/0035971 A1 Jan. 31, 2019

(30) Foreign Application Priority Data

Jul. 26, 2017 (JP) .............................. JP2017-144895
Jan. 26, 2018 (JP) .............................. JP2018-011920

(51) Int. Cl.
*H01L 33/62* (2010.01)
*H01L 33/00* (2010.01)
*G03G 15/04* (2006.01)

(52) U.S. Cl.
CPC ... *H01L 33/0095* (2013.01); *G03G 15/04054* (2013.01); *H01L 33/62* (2013.01); *H05K 2201/09709* (2013.01)

(58) Field of Classification Search
CPC .............. B41J 2/435–447; B41J 2/45; G03G 15/04054; H01L 33/62; H01L 23/48–535; H05K 2201/09781; H05K 2201/09709
See application file for complete search history.

(56) References Cited

U.S. PATENT DOCUMENTS

| 2003/0034567 A1* | 2/2003 | Sato | H01L 23/528 257/786 |
| 2005/0269702 A1* | 12/2005 | Otsuka | H01L 24/03 257/750 |
| 2006/0022601 A1* | 2/2006 | Kitazawa | H01L 27/3244 315/169.1 |
| 2007/0108628 A1* | 5/2007 | Ozawa | H01L 21/563 257/778 |

(Continued)

FOREIGN PATENT DOCUMENTS

| JP | 2004-193241 A | 7/2004 |
| JP | 2004-296474 A | 10/2004 |
| JP | 2007-81081 A | 3/2007 |

*Primary Examiner* — Matthew C Landau
*Assistant Examiner* — Eric K Ashbahian
(74) *Attorney, Agent, or Firm* — Metrolex IP Law Group, PLLC

(57) ABSTRACT

One of embodiments is a method of manufacturing driven element chips by dividing a semiconductor wafer into the driven element chips. The method includes preparing a semiconductor wafer which includes chip substrate portions arrayed in an array direction, and a clearance between the chip substrate portions adjacent to each other in the array direction. Each chip substrate portion includes: a conductive layer provided inside the chip substrate portion and including interconnect portions; and a dummy conductor provided in a part of the conductive layer where the interconnect portions are not provided.

10 Claims, 23 Drawing Sheets

(56) References Cited

U.S. PATENT DOCUMENTS

| | | | |
|---|---|---|---|
| 2007/0222077 A1* | 9/2007 | Ogihara | B41J 2/45 257/758 |
| 2010/0026214 A1* | 2/2010 | Nagumo | B41J 2/45 315/313 |
| 2010/0078705 A1* | 4/2010 | Chakihara | H01L 29/792 257/324 |
| 2011/0234734 A1* | 9/2011 | Nagumo | G03G 15/326 347/132 |
| 2014/0275950 A1* | 9/2014 | Hoseit | A61B 5/0215 600/407 |
| 2018/0006068 A1* | 1/2018 | Sekikawa | H01L 27/1462 |
| 2018/0035934 A1* | 2/2018 | Kiani | H01L 21/02425 |

* cited by examiner

LT : light emitting thyristor

LT : light emitting thyristor

LT : light emitting thyristor

66: equivalent circuit

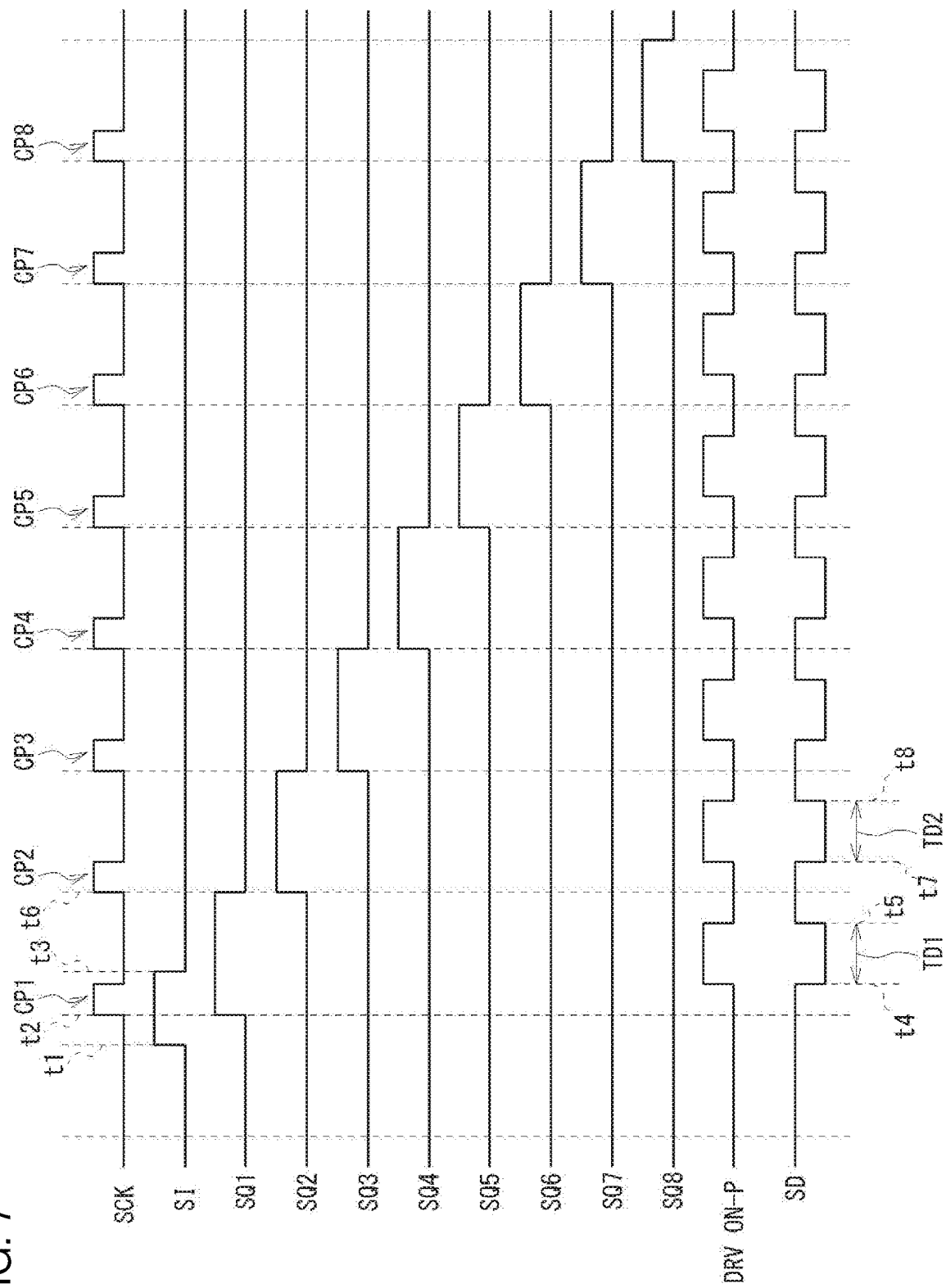

METHOD OF MANUFACTURING DRIVEN ELEMENT CHIP, DRIVEN ELEMENT CHIP, EXPOSING DEVICE, AND IMAGE FORMING APPARATUS

CROSS REFERENCE TO RELATED APPLICATIONS

This application claims priority based on 35 USC 119 from prior Japanese Patent Applications No. 2018-0011920 filed on Jan. 26, 2018 and No. 2017-0144895 filed on Jul. 26, 2017, the entire contents of which are incorporated herein by reference.

BACKGROUND

The disclosure relates to a method of manufacturing a driven element chip, a driven element chip, an exposing device, and an image forming apparatus, and is preferably applicable to an electrophotographic printer (hereinafter simply referred to as a printer as well), for example.

In a related art, a printer includes an exposing device with light emitting diodes (LEDs), light emitting thyristors or the like arrayed therein, and print an image by: selectively irradiating the surfaces of the photosensitive drums with light from the exposing device to form electrostatic latent images on the surfaces of the photosensitive drums; subsequently making toners adhere to the electrostatic latent images to form toner images; and developing the toner images.

In the exposing device, light emitting element chips (hereinafter also referred to as driven element chips) each provided with light emitting elements (hereinafter also referred to as driven elements) and driving circuits which respectively drive the light emitting elements, and the like are mounted in an arrayed pattern on a predetermined circuit board.

There has been a proposal for a light emitting element chip with epitaxial films (hereinafter also referred to as epi-films), sheet-shaped semiconductor thin films, bonded on its surface (see Patent Document 1 (FIG. 5 and the like), for example). The epi-films each with light emitting elements formed thereon in advance are bonded to the surface of the light emitting element chip.

Patent Document 1: Japanese Patent Application Publication No. 2007-81081.

SUMMARY

Meanwhile, interconnect layers each including an interconnect pattern made of metal such as aluminum (hereinafter also referred to as metal layers) are formed in internal parts of the light emitting element chip near the surface. There is likelihood that the surface of the light emitting element chip has a shape in which the area of the light emitting element chip where the interconnect patterns are formed is higher than the other area of the light emitting element chip.

This shape makes it difficult to stably bond the epi-films to the surface of the light emitting element chip, and thus leads to a risk of quality degradation such as tilting the optical axis of light emitted from each light emitting element. In addition, such a light emitting element chip involves likelihood that: the epi-film bonded to the surface of the light emitting element chip forms a gap between the surface and the epi-film; and during the subsequent etching process, an etchant and gases enter the gap and unnecessarily etch the surface of the light emitting element chip.

With this taken into consideration, the light emitting element chip may be formed by using a method in which electrically-insulated metal pieces (hereinafter referred to as dummy metals or dummy conductors) having the same thickness, and made of the same material, as the interconnect patterns are arranged in a part of the interconnect layers where no interconnect pattern is formed. In this case, difference in elevation between the parts of the light emitting element chip where the interconnect patterns are formed and the other part of the light emitting element chip is very small, and the flatness of the surface of the light emitting element chip increases. The epi-film, therefore, can be stably bonded to the surface of the light emitting element chip.

Like a general semiconductor element, the light emitting element chip is manufactured by a manufacturing process in which an exposure process and the like are performed on the surface of a semiconductor wafer made of silicon or the like. In this semiconductor wafer, light emitting elements, driving circuits and the like in the light emitting element chips arrayed in a matrix are simultaneously formed by the exposure process and the like. Thereafter, the semiconductor wafer is cut by a dividing process, such as dicing into the light emitting element chips in the shape of the matrix.

Particularly in a case where the dummy metals are arranged in each light emitting element chip, a method generally used for the dicing is to cut the semiconductor wafer using a cutter which rotates a thin disk-shaped blade at high speed. In general, however, accuracy in the position where to cut the semiconductor wafer using the cutter which rotates the blade is low because the rotating blade "wobbles" to some extent.

In other words, the light emitting element chip involves a problem that: in a case where the dummy metals are arrange in the light emitting element chip for the purpose of making the surface of the light emitting element chip flat enough to stably bond the epi-films to the light emitting element chips, it is difficult to cut the semiconductor wafer accurately by the dicing in the production; and the quality is thus likely to deteriorate.

An object of one embodiment is to propose a driven element chip manufacturing method which can easily manufacture a high-quality driven element chip.

A first aspect is a method of manufacturing driven element chips by dividing a semiconductor wafer into the driven element chips. The method includes: (i) preparing a semiconductor wafer which includes chip substrate portions arrayed in an array direction, and a clearance between the chip substrate portions adjacent to each other in the array direction, wherein each chip substrate portion including: a conductive layer provided inside the chip substrate portion, and including interconnect portions; and a dummy conductor provided in a part of the conductive layer where the interconnect portions are not provided; (ii) forming a groove by etching in a part of a surface of the semiconductor wafer under which the clearance is provided; (iii) before or after the formation of the groove by etching, forming a driven element group on a surface of each chip substrate, the driven element group including arrayed driven elements; and (iv) dividing, along the groove, the semiconductor wafer that has the driven element groups thereon to obtain the driven element chips.

A second aspect is a driven element chip that includes: a chip substrate including an arrangement surface; a driven element group provided on the arrangement surface, and including driven elements arrayed in an array direction; a conductive layer arranged inside the chip substrate, and including interconnect portions electrically connected to the driven elements or components that drive the driven elements; and a dummy conductor arranged in a part of the conductive layer where the interconnect portions are not arrange.

At least a side surface of the chip substrate in the array direction, which is a chip substrate side surface, is formed by performing an etching process on the arrangement surface.

A third aspect is an exposing device that includes the driven element chips according to the third aspect; and a substrate on which the driven element chips are mounted in an array in a main scanning direction. The driven elements provided to the driven element chips are light emitting elements.

A fourth aspect is an image forming apparatus that includes the exposing device according to the fourth aspect; and a controller which supplies a signal to the exposing device depending on an image to be formed.

At least one of the above aspects makes it possible to easily manufacture a high-quality driven element chip, a high-quality driven element chip, a high-quality exposing device, or a high-quality image forming apparatus.

BRIEF DESCRIPTION OF DRAWINGS

FIG. 7 is a schematic diagram illustrating how the print head works to emit light;

DETAILED DESCRIPTION

Figure 1:
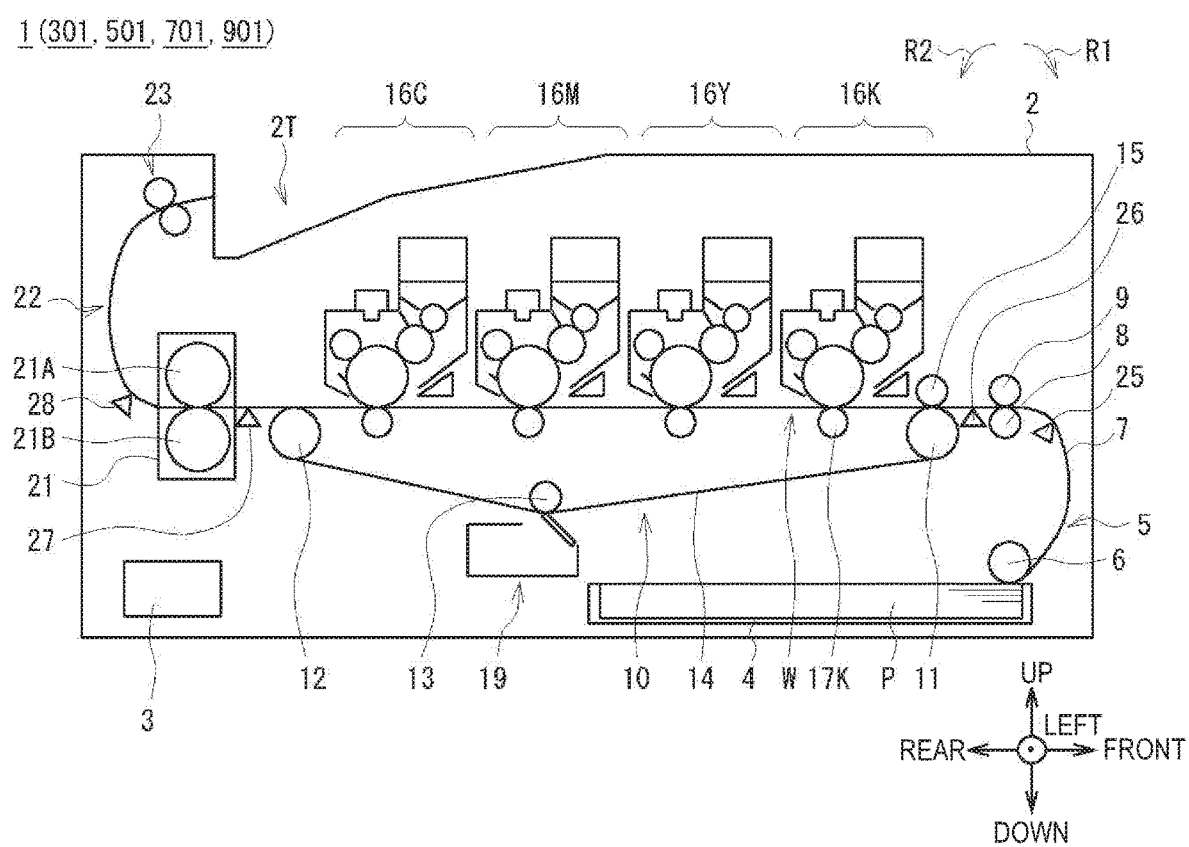
FIG. 1 is a schematic diagram illustrating an overall configuration of an image forming apparatus.

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

1. First Embodiment (1-1. Configuration of Image Forming Apparatus)

As illustrated in FIG. 1, an image forming apparatus 1 according to the first embodiment is a so-called multifunctional peripheral (MFP). The image forming apparatus 1 has a printer function of forming (or printing) an image on a sheet as a medium, an image scanner function of reading an image, and a communications function. The image forming apparatus 1, therefore, can act as a printer, a copying machine, a facsimile machine and the like by combining these functions. When functioning as the printer, this image forming apparatus 1 is capable of printing a desired color image on sheets P such as an A-3 size sheet and an A-4 size sheet.

The image forming apparatus 1 includes various parts which are arranged inside a substantially box-shaped printer housing 2. Incidentally, directions Up, Down, Left, Right, Frontward and Rearward relative to the image forming apparatus 1 are defined with a right end portion of the image forming apparatus 1 in FIG. 1 regarded as the front of the image forming apparatus 1. The following descriptions are provided using these relative directions.

The image forming apparatus 1 is designed such that a controller 3 centrally controls the entirety of the image forming apparatus 1. The controller 3 is wirelessly or wiredly connected to a host apparatus (not illustrated), such as a computer. When the host apparatus gives the controller 3 image data representing an image to be printed as well as an instruction to print the image represented by the image data, the controller 3 performs a printing process to form a printed image on a sheet P. For example, the controller 3 can be implemented using: a memory as a storage device that stores a program; and a processor that executes the program stored in the memory. Otherwise, parts of the controller 3 may be implemented using a semiconductor integrated circuit, and the rests of the controller 3 may be implemented using: a memory as a storage device that stores a program; and a processor that executes the program stored in the memory.

A sheet containing cassette 4 in which to contain sheets P is provided in the lowermost portion of the printer housing 2. A sheet feeding section 5 is provided above the sheet containing cassette 4. The sheet feeding section 5 includes a hopping roller 6, a conveyance guide 7, a registration roller 8 and a pinch roller 9. The hopping roller 6 is arranged above the sheet containing cassette 4. The conveyance guide 7 guides a sheet P upward along a conveyance passage W. The registration roller 8 and the pinch roller 9 face each other with the conveyance passage W interposed in between.

Under the control of the controller 3, the sheet feeding section 5 rotates the rollers depending on the necessity. Thereby, the sheet feeding section 5 picks up sheets P on a one-by-one basis by continuously separating one sheet P from the rest of a stack of sheets P contained in the sheet containing cassette 4. Thereafter, the sheet feeding section 5 causes the conveyance guide 7 to move each picked-up sheet P upward along the conveyance passage W, subsequently turn the sheet P toward the upper rear, and bring the sheet P into contact with the registration roller 8 and the pinch roller 9. Because of its rotations inhibited depending on the necessity, the registration roller 8 corrects the so-called skewing of the sheet P, that is to say, the inclination of the sides of the sheet P to the movement direction of the sheet P, by making frictional force work on the sheet P in cooperation with the pinch roller 9. Thereby, the registration roller 8 sends out the sheet P toward the rear with the leading and trailing edges of the sheet P aligned between the left and right.

Behind the registration roller 8 and the pinch roller 9, the conveyance passage W is formed extending substantially in the front-rear direction. An intermediate conveyance section 10 is arranged under the conveyance passage W. The intermediate conveyance section 10 has a structure in which a conveyance belt 14 made of an endless belt is stretched by the circumferences of the a front roller 11 arranged in the front side, a rear roller 12 arranged in the rear side, and a lower roller 13 arranged in the lower side. In addition, above the front roller 11, an adsorption roller 15 is provided in a position facing the front roller 11 with the conveyance belt 14 interposed in between.

While a driving force is being transmitted to the rear roller 12 from a predetermined belt driving motor (not illustrated), the intermediate conveyance section 10 rotates the rear roller 12 in a direction indicated with an arrow R2 to thereby make the conveyance belt 14 run. Thus, the conveyance belt 14 makes its upper portion along the conveyance passage W, that is to say, its portion stretched between the front roller 14 and the rear roller 15, run in the rearward direction. Upon receipt of a sheet P from the sheet feeding section 5 during the run, the intermediate conveyance section 10 holds the sheet P and the conveyance belt 14 between the adsorption roller 15 and the front roller 11, and moves the sheet P, as placed on the conveyance belt 14, toward the rear in response to the run of the conveyance belt 14.

Above the intermediate conveyance section 10, specifically on the opposite side of the intermediate conveyance section 10 from the conveyance passage W, four image forming units 16C, 16M, 16Y, 16K are arranged in this order from the rear to the front. The image forming units 16C, 16M, 16Y, 16K (hereinafter generically referred to as an image forming unit 16 as well) correspond to colors cyan (C), magenta (M), yellow (Y) and black (K), respectively. They are different from one another in terms of which colors they respectively handle, but all have the same configuration.

Figure 2:
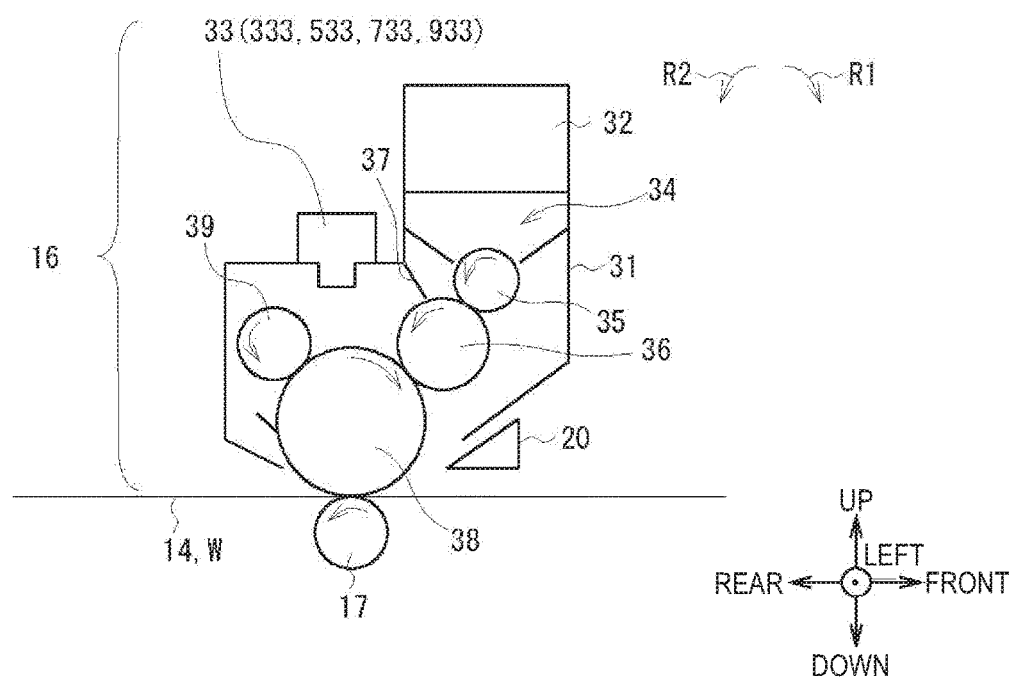
FIG. 2 is a schematic diagram illustrating a configuration of an image forming unit.

As illustrated in a schematic side diagram in FIG. 2, the image forming unit 16 includes an image forming section 31, a toner cartridge 32 and a print head 33. The conveyance belt 14 is interposed between the image forming unit 16 and a transfer roller 17 which is arranged under the image forming unit 16. Incidentally, the image forming unit 16 and its components are long enough in the left-right direction of the sheet P (hereinafter also referred to as a main scanning direction) to correspond to the left-right length of the sheet P. Most of the components, therefore, are longer in the left-right direction than in the front-rear direction and in the up-down direction, and are formed in a shape which is elongated in the left-right direction.

The toner cartridge 32 contains toner as developer, and is arranged and mounted on the image forming section 31. The toner cartridge 32 supplies the contained toner to a toner container 34 in the image forming section 31. The image forming section 31 includes the toner container 34, a supplying roller 35, a developing roller 36, a restriction blade 37, a photosensitive drum 38 and a charging roller 39 which are all incorporated therein.

The supplying roller 35 is formed in the shape of a column with its center axis extending in the left-right direction. An elastic layer made of conductive urethane foam or the like is formed on the circumferential side surface of the supplying roller 35. The developing roller 36 is formed in the shape of a column with its center axis extending in the left-right direction. An elastic layer having elasticity, a surface layer having conductivity, and the like are formed on the circumferential side surface of the developing roller 36. The restriction blade 37 is made, for example, of stainless steel plate with a predetermined thickness. The restriction blade 37 is slightly elastically deformed with part of the restriction blade 37 in contact with the circumferential side surface of the developing roller 36. The photosensitive drum 38 is formed in the shape of a column with its center axis extending in the left-right direction. A charge generating layer and a charge carrying layer each in a thin film shape are formed on the circumferential side surface of the photosensitive drum 38 in this order. The photosensitive drum 38, therefore, is electrically chargeable. The charging roller 39 is formed in the shape of a column with its center axis extending in the left-right direction. The circumferential side surface of the charging roller 39 is covered with a conductive elastic layer. The circumferential side surface of the charging roller 39 is in contact with the circumferential side surface of the photosensitive drum 38.

Furthermore, on the lower front side of the image forming section 31, an electricity removing light source 20 is provided in a position upstream of a place where the photosensitive drum 38 and the conveyance belt 14 are in contact with each other. The electricity removing light source 20 irradiates the photosensitive drum 38 with predetermined light to thereby remove static electricity charged on the photosensitive drum 38.

A drum motor (not illustrated) supplies a driving force to the image forming section 31. Thereby, the image forming section 31 rotates the supplying roller 35, the developing roller 36 and the charging roller 39 in the direction indicated with the arrow R2 (in a counterclockwise direction in FIG. 2), and rotates the photosensitive drum 38 in a direction indicated with an arrow R1 (in a clockwise direction in FIG. 2). Moreover, the image forming section 31 applies predetermined bias voltages respectively to the supplying roller 35, the developing roller 36, the restriction blade 37 and the charging roller 39, and electrically charges them.

The supplying roller 35 is electrically charged to thereby make the toner, inside the toner container 34, adhere to its circumferential side surface, and rotates to thereby make this toner adhere to the circumferential side surface of the developing roller 36. After the restriction blade 37 removes excessive toner from the circumferential side surface of the developing roller 36, the developing roller 36 brings its circumferential side surface into contract with the circumferential side surface of the photosensitive drum 38.

Meanwhile, while electrically charged, the charging roller 39 is in contact with the photosensitive drum 38, and thereby electrically charges the circumferential side surface of the photosensitive drum 38 evenly. The print head 33 includes light emitting element chips which are arranged in a line in the left-right direction (although later described in detail). The print head 33 exposes the photosensitive drum 38 by irradiating the photosensitive drum 38 with light at each predetermined time interval in a light emitting pattern based on an image data signal supplied from the controller 3 (FIG. 2). Thereby, in the vicinity of the upper end of the photosensitive drum 38, an electrostatic latent image is formed on the circumferential side surface of the photosensitive drum 38.

The photosensitive drum 38 continues rotating in the direction indicated with the arrow R1, and brings its part having the thus-formed electrostatic latent image into contact with the developing roller 36. Thereby, based on the electrostatic latent image, the toner adheres to the circumferential side surface of the photosensitive drum 38 to form a toner image based on the image data. The photosensitive drum 38 develops the toner image.

The transfer roller 17 is located immediately under the photosensitive drum 38. An upper-side portion of the conveyance belt 14 is interposed between the vicinity of an upper end of the circumferential side surface of the transfer roller 17 and the vicinity of a lower end of the photosensitive drum 38. A predetermined bias voltage is applied to the transfer roller 17, while a driving force is supplied to the transfer roller 17 from the drum motor (not illustrated) to make the transfer roller 17 rotate in the direction indicated with the arrow R2. By these, the image forming unit 16 is capable of transferring the developed toner image from the circumferential side surface of the photosensitive drum 38 onto a sheet P in a case where the sheet P is being conveyed along the conveyance passage W.

While the sheet P is being conveyed from the front along the conveyance passage W, the image forming units 16 superimpose their respective color toner images one after another by transferring the toner images onto the sheet P in the above-discussed way, and move the sheet P toward the rear.

Moreover, a cleaning section 19 is provided under the lower roller 13 of the intermediate conveyance section 10 (FIG. 1). Since toner adheres to the conveyance belt 14 because of inadequate transfer and the like of the sheet P which occur while the image forming apparatus is performing the image forming process, the cleaning section 19 cleans the surface of the conveyance belt 14 by scraping the toner off the surface of the conveyance belt 14. This makes it possible for the intermediate conveyance section 10 to prevent so-called offset, in which toner adheres to and smears the back surface of an incoming sheet P, that is to say, the surface which faces downward along the conveyance passage W, and which no toner image is intended to be transferred onto.

A fuser 21 is provided in the vicinity of a rear end of the intermediate conveyance section 10. The fuser 21 includes a heating roller 21A and a pressure roller 21B which are arranged facing each other with the conveyance passage W interposed in between. The heating roller 21A is formed in the shape of a cylinder with its center axis extending in the left-right direction, and has a heater in its inside. The pressure roller 21B is formed in the shape of a cylinder, like the heating roller 21A. The pressure roller 21B presses its upper-side surface against the lower-side surface of the heating roller 21A with a predetermined pressing pressure.

Under the control of the controller 3, the fuser 21 heats the heating roller 21A, as well as concurrently rotates the heating roller 21A and the pressure roller 21B in their respective directions. Thereby, the fuser 21 applies heat and pressure to the sheet P received from the intermediate conveyance section 10, that is to say, the sheet P having the four transferred and superimposed color toner images, and thereby fuses the toners onto the sheet P. Subsequently, the fuser 21 delivers the resultant sheet P to the next section.

A sheet delivery section 22 is arranged behind the fuser 21. Like the sheet feeding section 5, the sheet delivery section 22 includes a combination of a guide, conveyance rollers and the like. Under the control of the controller 3, the sheet delivery section 22 rotates the conveyance rollers depending on the necessity. Thereby, the sheet delivery section 22 conveys the sheet P, delivered from the fuser 21, toward the upper rear, subsequently turns the sheet P toward the front, and eventually delivers the sheet P into a delivery tray 2T which is formed in the upper surface of the printer housing 2.

Furthermore, inside the printer housing 2, sheet sensors 25, 26, 27, 28 which detect the sheet P are provided in places along the conveyance passage W depending on the necessity. The sheet sensors 25, 26, 27, 28 detect whether a sheet P exists on the conveyance passage W, and inform the controller 3 of obtained detection results. Depending on the detection results, the controller 3 appropriately controls the rotations of the respective conveyance rollers, the run of the conveyance belt 14 in the intermediate conveyance section 10, and the like.

Figure 3:
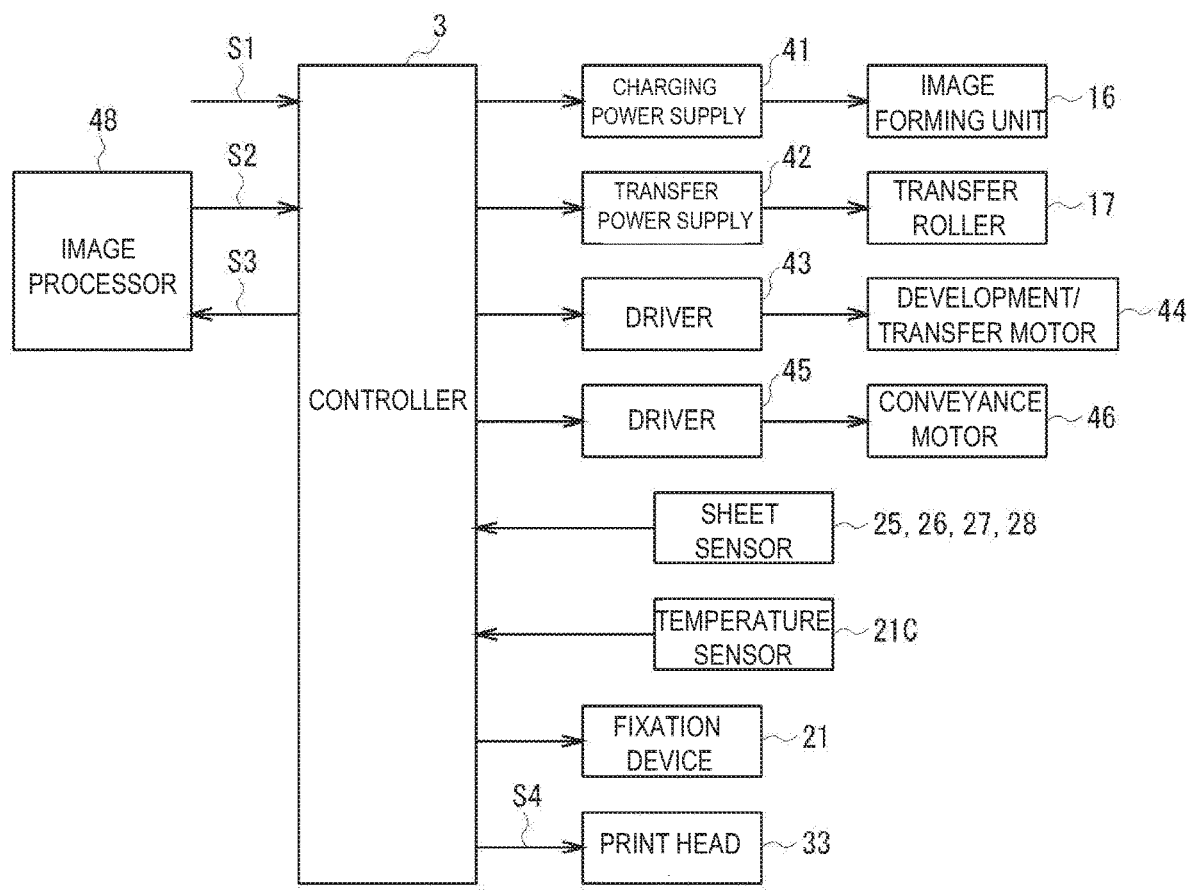
FIG. 3 is a schematic diagram illustrating a block configuration of the image forming apparatus.

Next, referring to FIG. 3, descriptions are provided for a block configuration of the image forming apparatus 1. The controller 3 receives a control signal 51 from the host apparatus (not illustrated) such as a computer, and starts a printing operation based on a print instruction included in the control signal 51.

To put it specifically, to begin with, the controller 3 determines whether the temperature of the fuser 21 is within a predetermined temperature range, using a fuser temperature sensor 21C (FIG. 3) which is provided inside the fuser 21 (FIG. 1). If the controller 3 determines that the temperature of the fuser 21 is lower than the temperature range, the controller 3 heats the fuser 21 by electrifying the heating roller 21A (FIG. 1) to make the temperature of the fuser 21 fall within the temperature range.

The controller 3 further causes the driver 43 to rotate a development/transfer process motor 44, and to operate a charging high-voltage power supply 41. Thereby, the controller 3 rotates and electrically charges the charging roller 39 and the like in each image forming unit 16 (FIG. 2).

Moreover, the controller 3 causes a driver 45 to rotate a sheet conveyance motor 46, and thereby rotates the hopping roller 6 and the like in the sheet feeding section 5 (FIG. 1). By this, the controller 3 sends sheets P on the one-by-one basis from the inside of the sheet containing cassette 4 while continuously separating one sheet P from the rest of the sheets P, and conveys the sheets P one after another along the conveyance passage W. In addition, the controller 3 recognizes the position and conveyance condition of each conveyed sheet P based on the detection results obtained from the sheet sensors 25 to 28 and the like, as well as does things such as adjusting the conveyance speed of the sheet P.

Meanwhile, an image processor 48 performs a predetermined image process on the image data supplied from the host apparatus, and generates image formation data for each page. Based on the detection result and the like from the sheet sensor 26, the controller 3 send a timing signal S3 to the image processor 48 at a time when the sheet P reaches a position immediately before a printable place, for example, the image forming unit 16K (FIG. 1). This timing signal S3 includes a main scanning synchronization signal and a sub-scanning synchronization signal.

In response to this, the image processor 48 generates a video signal S2 in which the generated image formation data are divided into data pieces respectively corresponding to lines, and sends the video signal S2 to the controller 3. Based on the video signal S2, the controller 3 generates a print data signal S4, and sends the print data signal S4 to the print head 33 in the image forming unit 16 (FIG. 2). Thereby, the print head 33 is capable of forming electrostatic latent images representing the respective lines, one after another, on the circumferential side surface of the photosensitive drum 38 by irradiating the circumferential side surface of the photosensitive drum 38 with light in the light emitting pattern based on the image data.

(1-2. Circuit Configuration of Print Head)
(1-2-1. Connection of Components in Print Head)

Figure 4:
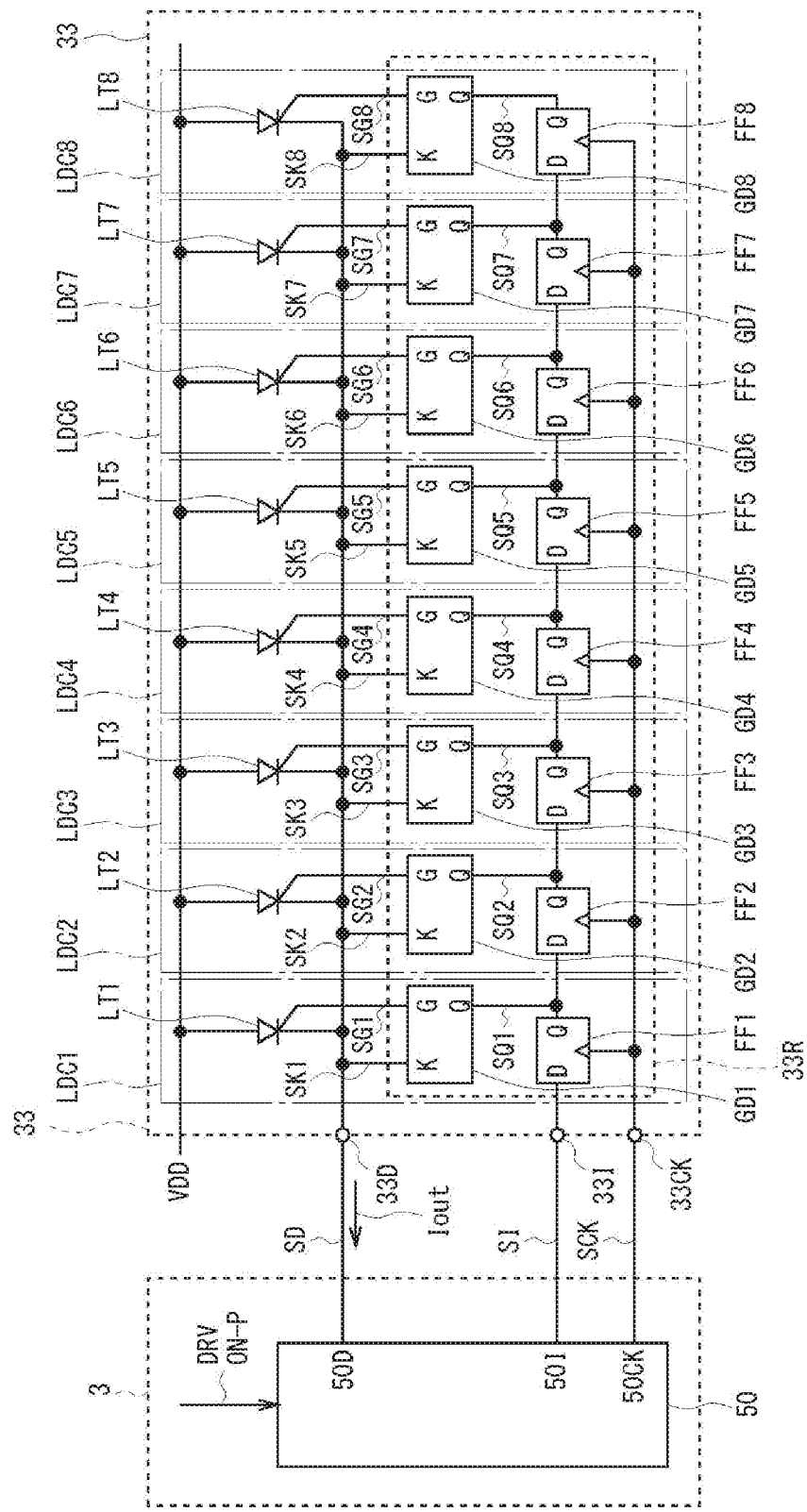
FIG. 4 is a schematic circuit diagram illustrating a circuit configuration of a print head.

Next, referring to FIG. 4, descriptions are provided for how to connect components in a circuit configuration of the print head 33. The print head 33 serving as an exposing device includes light emitting thyristors LT (LT1, LT2, ... ), flip flops FF (FF1, FF2, ... ), and gate driving circuits GD (GD1, GD2, ... ).

Each flip flop FF and each gate driving circuit GD are provided inside a shift register 33R. For the sake of explanation convenience, a circuit including a combination of one light emitting thyristor LT, one flip flop FF, and one gate driving circuit GD is hereinafter also referred to as a light emission driving circuit LDC (LDC1, LDC2, ... ). Furthermore, the gate driving circuits GD and the flip flops FF are generically referred to as driving circuits.

It should be noted that the shift register 33R is manufactured by using a well-known complementary metal oxide semiconductor (CMOS) structure on a semiconductor wafer made of silicon or the like. Otherwise, the shift register 33R may be manufacture by applying a thin film transistor (TFT) technology to a glass substrate.

Meanwhile, the controller 3 is provided with a drive control circuit 50 which controls drives of the respective light emission driving circuits LDC in the print head 33. The drive control circuit 50 is supplied with a drive instruction signal DRV ON-P from the outside, as well as includes a serial data terminal 50I, a clock terminal SOCK and a data terminal 50D which output various signals.

The drive control circuit 50 generates a rectangular-wave clock signal SCK with a predetermined clock frequency, and supplies the clock signal SCK to a clock terminal 33CK of the print head 33 via the clock terminal SOCK. The drive control circuit 50 further generates a serial data signal SI corresponding to the image data, and supplies the serial data signal SI to a serial data terminal 33I of the print head 33 via the serial data terminal 50I. In addition, the drive control circuit 50 obtains an electrical potential by inverting the supplied drive instruction signal DRV ON-P, and applies the electrical potential to the data terminal 50D. The data terminal 50D is connected to a data terminal 33D of the print head 33.

It should be noted that a power supply circuit (not illustrated) supplies a predetermined power supply voltage VDD to the print head 33 via a power supply terminal (not illustrated), and is connected to the ground via a ground terminal (not illustrated). Thus, the number of connecting lines which electrically connect the print head 33 to the outside, including the drive control circuit 50 and the power supply circuit (not illustrated), is five.

Meanwhile, in the print head 33, the clock terminal 33CK, the serial data terminal 33I and the data terminal 33D are connected to the light emission driving circuits LDC. The clock terminal 33CK is connected to clock input terminals of the respective flip flops FF. The clock terminal 33CK supplies the clock signal SCK, supplied from the drive control circuit 50, to the flip flops FF. The flip flops FF accordingly operate at timing synchronized with the clock signal SCK.

The serial data terminal 33I is connected to an input terminal D of a first-stage flip flop FF1. An output terminal Q of the flip flop FF1 is connected to an input terminal D of a second-stage flip flop FF2, and is connected to an input terminal Q of a gate driving circuit GD1. Thus, based on the serial data signal SI supplied from the serial data terminal 33I, the flip flop FF1 generates an output signal SQ1 at timing of the clock signal SCK, and supplies the output signal SQ1 to the gate driving circuit GD1 and the second-stage flip flop FF2.

It should be noted that the second- and subsequent-stage flip flops FF (FF2, FF3, ... ) generates output signals SQ (SQ2, SQ3) at the timing of the clock signal SCK based on output signals SQ (SQ1, SQ2, ... ) supplied from the output terminals Q of the previous-stage flip flops FF, and supply the output signals SQ (SQ2, SQ3) to the gate driving circuits GD and the subsequent-stage flip flops FF. In other words, each flip flop FF shifts the serial data signal SI to the next-stage flip flop FF at each cycle of the clock signal SCK.

An output terminal K of each gate driving circuit GD is connected to a cathode terminal of the corresponding light emitting thyristor LT, and the data terminal 33D. An output terminal G of the gate driving circuit GD is connected to a gate terminal of the light emitting thyristor LT. The power supply circuit supplies the power supply voltage VDD to an anode terminal of the light emitting thyristor LT.

(1-2-2. Configuration and Basic Operation of Gate Driving Circuit)

Figure 5A:
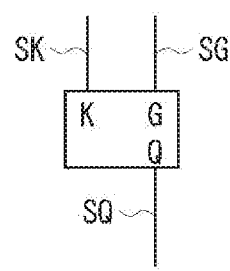
FIGS. 5A and 5B are schematic diagrams illustrating a configuration of a gate driving circuit.
Figure 5B:
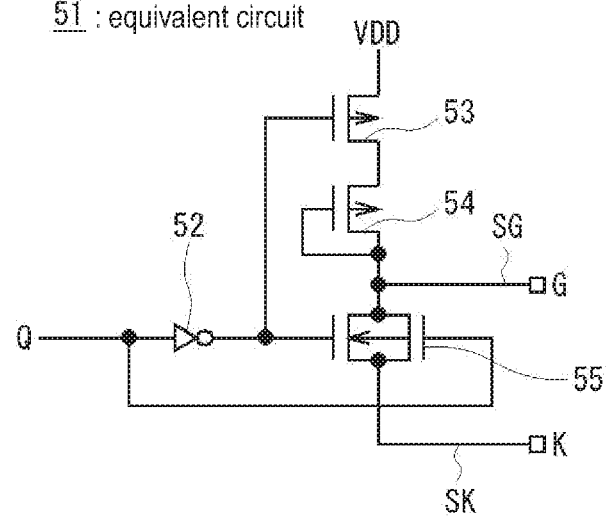

Each gate driving circuit GD (FIG. 4) includes the single input terminal Q and the two output terminals G, K, as indicated with their respective symbols in FIG. 5A. The gate driving circuit GD has electrical characteristics equivalent to those of an equivalent circuit 51 illustrated in FIG. 5B. The equivalent circuit 51 includes an inverter 52, PMOS transistor 53, 54, and an analog switch 55. The analog switch 55 has a circuit configuration in which: source terminals of its NMOS and PMOS transistors are connected in parallel to each other; and drain terminals of the NMOS and PMOS transistors are connected in parallel to each other. The source terminals are hereinafter referred to as a first terminal of the analog switch 55, and the drain terminals are hereinafter referred to as a second terminal of the analog switch 55.

The input terminal Q is connected to the input terminal of the inverter 52, and the gate terminal of the PMOS transistor in the analog switch 55. The output terminal of the inverter 52 is connected to the gate terminal of the NMOS transistor in the analog switch 55, and the gate terminal of the PMOS transistor 53.

The source terminal of the PMOS transistor 53 is connected to the power supply circuit (not illustrated), and the power supply circuit supplies the predetermined power supply voltage VDD to the PMOS transistor 53. The drain terminal of the PMOS transistor 53 is connected to the source terminal of the PMOS transistor 54. The drain terminal of the PMOS transistor 54 is connected to the gate terminal of the PMOS transistor 54, the output terminal G, and the first terminal of the analog switch 55. The second terminal of the analog switch 55 is connected to the output terminal K.

Because of the above configuration, the gate driving circuit GD works as follows. Once a high-level signal is supplied to the input terminal Q, the output signal from the inverter 52 falls to the low level, and the PMOS transistors 53, 54 both turn ON. Thus, the output signal SG outputted from the output terminal G rises to the high level. Simultaneously, the analog switch 55 turns OFF, and electrically disconnects the second terminal from the first terminal. In other words, the analog switch 55 electrically separates the output terminal K from the output terminal G.

The gate driving circuit GD further works as follows. Once a low-level signal is supplied to the input terminal Q, the analog switch 55 turns ON, and electrically connects the second terminal to the first terminal. In other words, the analog switch 55 electrically connects the output terminal K to the output terminal G. Simultaneously, the PMOS transistors 53, 54 in the gate driving circuit GD both turn OFF.

(1-2-3. Structure and Basic Operation of Light Emitting Thyristor)

Figure 6A:
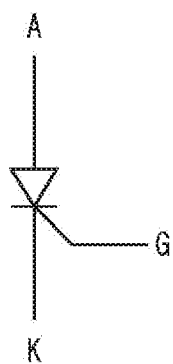
FIGS. 6A to 6D are schematic diagrams illustrating a structure of a light emitting thyristor.

Next, descriptions are provided for the structure and basic operation of the light emitting thyristor LT. The light emitting thyristor LT as the driven element has a configuration similar to that of a general light emitting diode (LED), and functions as a so-called light emitting element which emits light when supplied with a current. The light emitting thyristor LT includes three terminals, each called an anode (A), a cathode (K) and a gate (G), as indicated with their respective circuit symbols in FIG. 6A. The light emitting thyristor LT is a three-terminal switching element including a control electrode (or a gate terminal) whose threshold voltage or threshold current can be controlled from the outside.

Figure 6B:
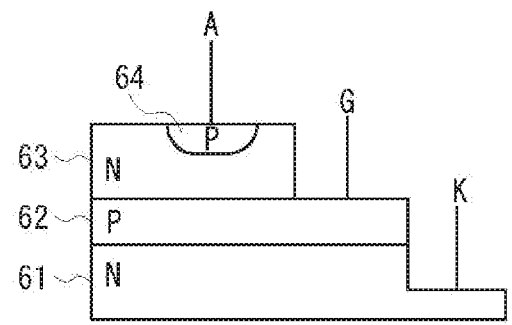

The light emitting thyristor LT has a structure in which layers made of their respective materials whose characteristics are different from one another are stacked together, as illustrated in a schematic diagram in FIG. 6B. The light emitting thyristor LT is manufactured, for example, by: using a GaAs wafer base material; and epitaxially growing predetermined crystals on the GaAs wafer base material by a well-known metal organic-chemical vapor deposition (NO-CVD) method.

A specific method of manufacturing the light emitting thyristor LT is as follows. A predetermined buffer layer (not illustrated) and a predetermined sacrificial layer (not illustrated) are epitaxially grown on the GaAs wafer base material. Thereafter, an N-type impurity introduced N-type layer 61, a P-type impurity introduced P-type layer 62 and an N-type impurity introduced N-type layer 63 are stacked on an AlGaAs wafer base material in this order. Thereby, an intermediate product of the light emitting thyristor LT is formed as the wafer with the three-layered structure, or the NPN structure.

Thereafter, the intermediate product of the light emitting thyristor LT is processed by applying well-known photolithography to a part of the uppermost layer, that is to say, the N-type layer 63 to selectively form a P-type impurity-introduced P-type region 64 in the N-type layer 63. After that, well-known dry etching is applied to the resultant intermediate product of the light emitting thyristor LT to form predetermined groove portions in the intermediate product of the light emitting thyristor LT. Thereby, the intermediate product of the light emitting thyristor LT is divided into light emitting thyristors LT through element isolation. Furthermore, in the above-mentioned etching step, part of the lowermost layer, that is to say, the N-type layer 61, of the intermediate product of the light emitting thyristor LT is exposed, and a metal interconnect is formed in the thus-exposed region to form a cathode (K) electrode. Similarly, an anode (A) electrode and a gate (G) electrode are formed in the P-type layer 62 and the P-type region 64 in the intermediate product of the light emitting thyristor LT.

Figure 6C:
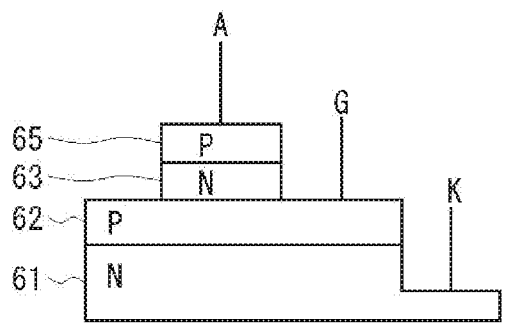

It should be noted that as illustrated in FIG. 6C, the light emitting thyristor LT can be manufactured using a method partially different from that illustrated in FIG. 6B. To put it specifically, like in the case using the method illustrated in FIG. 6B, an intermediate product of the light emitting thyristor LT is formed as a wafer with the three-layered structure, or the "NPN" structure, in which the N-type layer 61, the P-type layer 62 and the N-type layer 63 are stacked one after another in this order. Furthermore, a P-type impurity-introduced P-type layer 65 is formed on the N-type layer 63. Thus, the intermediate product of the light emitting thyristor LT is formed as a wafer with the four-layered structure, or the "PNPN" structure.

Subsequently, well-known dry etching is applied to the intermediate product of the light emitting thyristor LT to form predetermined groove portions in the intermediate product of the light emitting thyristor LT. Thereby, element isolation is performed on the intermediate product of the light emitting thyristor LT. Furthermore, like in the case illustrated in FIG. 6B, in the above-mentioned etching step, the lowermost layer, that is to say, the N-type layer 61, of the intermediate product of the light emitting thyristor LT is partially exposed, and a metal interconnect is formed in the thus-exposed region to form a cathode electrode. In addition, the uppermost layer, that is to say, the P-type layer 65, of the intermediate product of the light emitting thyristor LT is partially exposed to form an anode electrode, and the P-type layer 62 of the intermediate product of the light emitting thyristor LT is partially exposed to form a gate electrode.

Figure 6D:
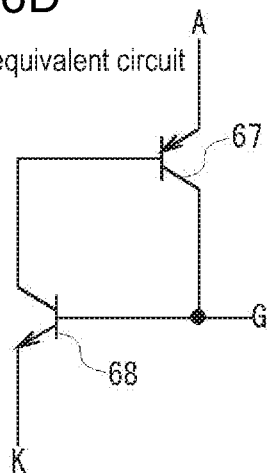

Each light emitting thyristor LT (FIGS. 6B and 6C) manufactured using the above procedure has electrical properties equivalent to those of an equivalent circuit 66 illustrated in FIG. 6D. The equivalent circuit 66 includes a PNP transistor 67 and an NPN transistor 68 in combination. To put it specifically, an emitter terminal of the PNP transistor 67 in the equivalent circuit 66 corresponds to the anode terminal of the light emitting thyristor LT; a base terminal of the NPN transistor 68 in the equivalent circuit 66 corresponds to the gate terminal of the light emitting thyristor LT; and an emitter terminal of the NPN transistor 68 in the equivalent circuit 66 corresponds to the cathode terminal of the light emitting thyristor LT. Moreover, in the equivalent circuit 66, the collector terminal of the PNP transistor 67 is connected to the base terminal of the NPN transistor 68, while the base terminal of the PNP transistor 67 is connected to the collector terminal of the NPN transistor 68.

The above-discussed configuration makes the light emitting thyristor LT work as follows. When the power supply circuit applies the predetermined power supply voltage to the anode terminal, the potential of the cathode terminal becomes lower and the potential of the gate terminal becomes higher. Thus, a trigger current flows between the two terminals. As triggered by this, a current flows between the anode terminal and the cathode terminal, and the light emitting thyristor LT enters into the light emitting state. When the potential of the cathode is raised to as a high level as that of the anode while the light emitting thyristor LT is in this light emitting state, the potential difference between the two terminals disappears, and the light emitting thyristor LT enters into the light-off state. In addition, while the potential of the gate terminal is lower, even if the potential appears between the anode terminal and the cathode terminal, no trigger current flows. The light emitting thyristor LT, therefore, maintains the light-off state without entering into the light emitting state.

It should be noted that the structure of the light emitting thyristor LT is not limited to one in which the AlGaAs layer is formed on the GaAs wafer. For example, the light emitting thyristor LT may have a structure using such materials as GaP, GaAs and AlGaInP. Otherwise, the light emitting thyristor LT may have a structure in which layers of GaN, AlGaN, InGaN and the like are formed on a sapphire substrate.

(1-3. Light Emitting Operation of Print Head)
(1-3-1. Basic Light Emitting Operation of Light Emission Driving Circuit)

First of all, descriptions are provided for how parts of the light emission driving LDC (FIG. 4), that is to say, each gate driving circuit GD and each light emitting thyristor LT, work to emit light. When the drive instruction signal DRV ON-P supplied to the drive control circuit 50 of the controller 3 from the outside falls to the low level, the drive control circuit 50 thereof raises a potential of the data terminal 50D to the high level, and thereby makes the potential of the cathode terminal of the light emitting thyristor LT substantially equal to the power supply voltage VDD.

In the light emission driving circuit LDC, the potential difference between the anode terminal and the cathode terminal in the light emitting thyristor LT becomes substantially equal to 0 volts, and the so-called gate current does not occur. The current Iout flowing into the data terminal 50D of the drive control circuit 50 accordingly becomes substantially equal to 0 amperes. In the light emission driving circuit LDC, thus, the light emitting thyristor LT enters into a non-light emitting state of not emitting light (that is to say, putting out light).

Meanwhile, in the light emission driving circuit LDC, when the drive instruction signal DRV ON-P rises to the high level, the potential of the data terminal 50D falls to the low level, and a sufficient potential difference thus occurs between in the drive control circuit 50 and the power supply voltage VDD. In the light emission driving circuit LDC, thereby, a sufficient potential difference occurs between the anode terminal and the cathode terminal in the light emitting thyristor LT.

While in this state, in a case where the serial data signal SI supplied to the light emission driving circuit LDC from the drive control circuit 50 is at the high level, the output signal SQ from the flip flop FF rises to the high level at timing of the clock signal SCK. In response to this, in the light emission driving circuit LDC, the output from the output terminal G of the gate driving circuit GD rises to the high level. A trigger current thus occurs in the gate terminal of the light emitting thyristor LT, and the light emitting thyristor LT enters into the light emitting state of emitting light (that is to say, producing light).

It should be noted that on this occasion, the current flowing through the cathode terminal of the light emitting thyristor LT in the light emission driving circuit LDC is the current Iout flowing into the data terminal 50D of the drive control circuit 50. The light emitting thyristor LT thus emits an amount of light corresponding to the magnitude of the current Iout.

As discussed above, the light emission driving circuit LDC is designed such that the light emitting thyristor LT enters into the light emitting state of emitting light at the timing of the clock signal SCK, only in the case where: the potential of the data terminal 50 is at the low level since the drive instruction signal DRV ON-P is at the high level; and the serial data signal SI is concurrently at the high level. The light emission driving circuit LDC is further designed such that the light emitting thyristor LT enters into the non-light emitting state in the other cases.

(1-3-2. Light Emitting Operation of Print Head)

Next, referring to a timing chart in FIG. 7, descriptions are provided for how the print head 33 works to emit light. Focusing on the 8 light emission driving circuits LDC1 to LDC8 like in the case illustrated in FIG. 4, the descriptions are provided for how to make the 8 light emission driving circuits LDC1 to LDC8 emit light.

Once the power supply is inputted into the image forming apparatus 1 (FIG. 1), the controller 3 (FIG. 4) performs a reset process on the shift registers 33 in the print head 33, as a preliminary operation. In this reset process, the drive control circuit 50 of the controller 3 generates as many clock pulses as the number of shift registers 33, that is to say, as many clock pulses as the number of flip flops FF (in this case, 8 clock pulses), in the clock signal SCK. Thus, in the print head 33, the output signals SQ1 to SQ8 from the respective flip flops FF in the shift register 33R all fall to the low level.

Meanwhile, in a case where the drive control circuit 50 of the controller 3 receives an image data printing order and the like from the host apparatus, the drive control circuit 50 raises the serial data signal SI from the low level to the high level at predetermined time t1 (FIG. 7). Subsequently, the drive control circuit 50 generates a first pulse CP1 with a relatively short pulse width in the clock signal SCK at time t2. Once the clock signal SCK rises to the high level, the first-stage shift register R, that is to say, the flip flop FF1 captures the serial data signal SI, and raises the output signal SQ1 to the high level at timing slightly later than when the flip flop FF1 captures the serial data signal SI. The drive control circuit 50 further causes the serial data signal SI to fall from the high level to the low level at time t3 which is later than time t2.

Once the output signal SQ1 rises to the high level like this, the gate driving circuit GD (FIGS. 4 and 6) raises the output signal SG1 outputted from the output terminal G to the high level, and electrically disconnects the output terminal K from the output terminal G, as discussed above. Thereby, in the light emitting thyristor LT1, the potential at the gate electrode rises.

Thereafter, the drive instruction signal DRV ON-P supplied to the drive control circuit 50 from the outside rises to the high level at time t4 (FIG. 7). In response to this, the drive control circuit 50 causes the potential of the data terminal 50D to fall to the low level. In the light emitting thyristor LT1, thus, the potential occurs between the gate terminal and the cathode terminal, and the trigger current flows between the two terminals. The light emitting thyristor LT1 accordingly turns on (gives light), and enters into the light emitting state.

At time t5 which is later than time t4 by a predetermined light emitting time period TD1, the drive instruction signal DRV ON-P supplied to the drive control circuit 50 from the outside falls to the low level. In response to this, the drive control circuit raises the potential of the data terminal 50D to the high level. Thus, in the light emitting thyristor LT, the potential difference between the anode terminal and the cathode terminal becomes substantially equal to 0 volts, and no current accordingly flows between the two terminals. The light emitting thyristor LT1, therefore, turns off (stops light emission), and enters into the non-light emitting state.

In this respect, the amount of light emitted by the light emitting thyristor LT, that is to say, the intensity of outgoing light from the light emitting thyristor LT depends mainly on the magnitude of the current flowing between the anode terminal and the cathode terminal. Employment of a driving circuit having constant-current characteristics as the drive control circuit 50 of the controller 3 (FIG. 4) accordingly makes it possible for the image forming apparatus 1 to keep the current Iout, flowing through the data terminal 50D, substantially constant. In this case, for example, even if the potential difference between the anode terminal and the cathode terminal slight varies from one light emitting thyristor LT to another, the magnitudes of the driving currents which flow through the light emitting thyristors LT can be kept substantially constant. The amounts of light emitted by the light emitting thyristors LT can be accordingly kept substantially constant.

Furthermore, the drive control circuit 50 causes the light emitting thyristor LT1 in the light emission driving circuit LDC1 to emit light by causing the potential of the data terminal 50D to fall to the low level at time t4, and to rise to the high level at time t5. If, therefore, the drive control circuit 50 causes the potential of the data terminal 50 to remain at the high level from time t4 through time t5, the drive control circuit 50 accordingly can prohibit the light emitting thyristor LT1 in the light emission driving circuit LDC1 from emitting light, that is to say, keep the light emitting thyristor LT1 in the non-light emitting state, during the period of time. In this way, the drive control circuit 50 controls whether to cause the light emitting thyristor LT1 in the light emission driving circuit LDC1 to emit light, by switching the potential of the data terminal 50D to the high level or the low level.

Thereafter, in the drive control circuit 50, the clock signal SCK again rises to the high level at time t7. On this occasion, the serial data signal SI is at the low level. Thus, the flip flop FF1 causes the output signal Q1 to fall to the low level at timing slightly later than time t6. Meanwhile, since the output signal Q1 at the high level is inputted into the input terminal D at time t6, the second-stage flip flop FF2 raises the output signal Q2 to the high level.

Subsequently, the drive instruction signal DRV-ON-P supplied to the drive control circuit 50 from the outside rises to the high level at time t7 like at time t4. In response to this, the drive control circuit 50 causes the potential of the data terminal 50 to fall to the low level. Thus, in the light emitting thyristor LT2, a potential occurs between the gate terminal and the cathode terminal, and a trigger current flows between the two terminals. The light emitting thyristor LT2 accordingly turns on (gives light), and enters into the light emitting state.

At time t8 which is later than time t7 by a predetermined light emitting time period TD2, the drive instruction signal DRV ON-P supplied to the drive control circuit 50 from the outside falls to the low level like at time t5. In response to this, the drive control circuit 50 raises the potential of the data terminal 50D to the high level. Thus, in the light emitting thyristor LT2, the potential difference between the anode terminal and the cathode terminal becomes substantially equal to 0 volts, and no current flows between the two terminals. The light emitting thyristor LT2 accordingly turns off (stops light emission), and enters into the non-light emitting state.

As discussed above, in the print head 33 (FIG. 4), the serial data signal SI is at the high level only in the short time from time t1 through time t3. The print head 33, therefore, raises only one of the output signals SQ1 to SQ8 from the flip flops FF1 to FF8 to the high level and causes the others of the output signals SQ1 to SQ8 to fall to the low level while switching the output signals SQ1 to SQ8 one after another, each time the clock signal SCK (FIG. 12) rises.

Accordingly, while the potential at the data terminal 50D in the drive control circuit 50 is at the low level, the print head 33 is capable of: selecting only a single light emitting thyristor LT whose output signal SQ is at the high level from the light emitting thyristors LT1 to LT8 corresponding to the output signals SQ1 to SQ8; and causing the selected light emitting thyristor LT to emit light.

Because of this configuration, the print head 33 may cause the light emitting thyristor LT to supply the gate current from the gate terminal to the cathode terminal by applying a forward-biasing potential difference to the PN junction portion between the gate terminal and the cathode terminal in the light emitting thyristor LT in order to cause the light emitting thyristor LT to turn on (emit light). In addition, the print head 33 may keep the potential difference between the gate terminal and the cathode terminal equal to or less than the forward voltage in order to cause the light emitting thyristor LT to remain in the non-light emitting state. For this reason, the potential difference may be made equal to zero, or a voltage may be applied in the reverse direction.

In addition, in a case where the output signal SQ from the flip flop FF in the print head 33 falls to the low level, the analog switch 55 in the equivalent circuit 51 (FIG. 5B) of the gate driving circuit GD turns into the ON state while both of the PMOS transistors 53, 54 in the equivalent circuit 51 turn into the OFF state. Thus, in the print head 33, no voltage is applied between the gate terminal and the cathode terminal in the light emitting thyristor LT, and no gate current occurs. This makes it possible to keep the light emitting thyristor LT in the OFF state (the non-light emitting state).

It should be noted that the print head 33 may make the light emitting time periods TD (TD1, TD2, . . . ) of the light emitting thyristors LT (LT1, LT2, . . . ) equal to one another, or different from one another. For example, in a case where the light emitting efficiencies of the respective light emitting thyristors LT vary from one to another, adjustment of the light emitting time periods TD depending on the light emitting efficiencies makes it possible for the print head 33 to control exposure energies from the light emitting thyristors LT in such a way that makes the exposure energies equal to one another.

(1-3-3. Turn-On Operation of Light Emitting Thyristor)

Figure 8A:
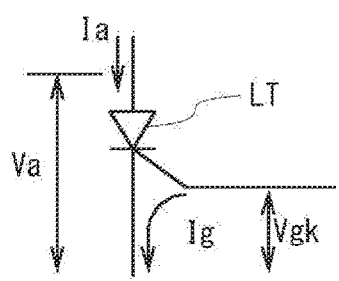
FIGS. 8A to 8D are schematic diagrams illustrating how the light emitting thyristor performs a turn-on operation.

Next, detailed descriptions are provided for the turn-on operation of the light emitting thyristor LT. FIG. 8A is a circuit diagram corresponding to FIG. 6A, and illustrates only the light emitting thyristor LT. As for the light emitting thyristor LT, the diagram in FIG. 8A defines an anode-cathode voltage Va, a gate-cathode voltage Vgk, an anode current Ia flowing through the anode terminal, and a gate current Ig flowing through the gate terminal.

Figure 8B:
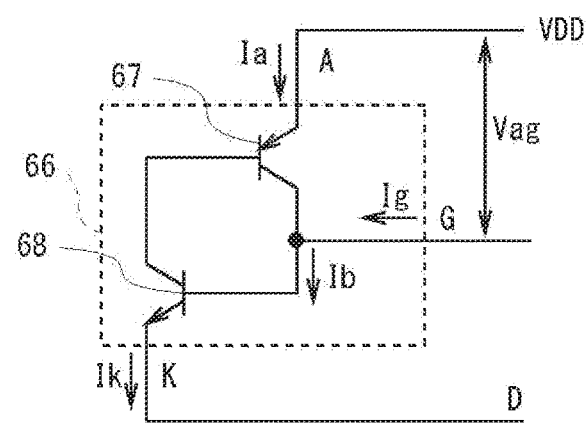

Like FIG. 6D, FIG. 8B is a circuit diagram which represents the light emitting thyristor LT using the equivalent circuit 66. Terminals in FIG. 8B which correspond to the anode terminal, cathode terminal and gate terminal of the light emitting thyristor LT are simply referred to as an anode terminal (A), a cathode terminal (K) and a gate terminal (G). The power supply circuit (not illustrated) applies the predetermined power supply voltage VDD to the anode terminal. The cathode terminal is connected to a data terminal D of a driving circuit (not illustrated) which corresponds to the data terminal 50D of the drive control circuit 50 (FIG. 4).

This equivalent circuit 66 defines a voltage Vag corresponding to the voltage between the anode terminal and the cathode terminal in the light emitting thyristor LT, and a base current Ib flowing through the base terminal of the NPN transistor 68 in the light emitting thyristor LT, in addition to the voltages and currents defined in FIG. 8A. The equivalent circuit 66 further defines a cathode current Ik flowing through the emitter terminal of the NPN transistor 68 which corresponds to the cathode terminal of the light emitting thyristor LT.

Here, it is examined how the light emitting thyristor LT turns on (gives light) in the case where the potential at the gate terminal in the equivalent circuit 66 illustrated in FIG. 8 is at the high level. Let us assume that the voltage at the data terminal D is at the low level in this case.

In this case, the gate current Ig flowing from the gate terminal to the cathode terminal occurs in the equivalent circuit 66. This gate current Ig is a forward current which flows through the PN junction portion between the gate terminal and the cathode terminal in the light emitting thyristor LT (FIG. 8A), that is to say, between the emitter terminal and the base terminal of the NPN transistor 68 in the equivalent circuit 66 (FIG. 8A).

The gate current Ig in the equivalent circuit 66 illustrated in FIG. 8B corresponds to the base current Ib in the NPN transistor 68. The flow of the base current Ib in the NPN transistor 68, therefore, causes the NPN transistor 68 to start to shift to the ON state, and to generate the collector current at the collector terminal. The collector current is equivalent to the base current of the PNP transistor 67 in the equivalent circuit 66. The PNP transistor 67, therefore, shifts to the ON state as well. The collector current generated in this process augments the base current Ib of the NPN transistor 68, and thereby accelerates the shift of the NPN transistor 68 to the ON state.

Meanwhile, in the equivalent circuit 66, after the PNP transistor 67 completes its shift to the ON state, the voltage between the collector terminal and the emitter terminal in the PNP transistor 67, that is to say, the anode-cathode voltage Vag in the light emitting thyristor LT drops while the potential at the gate terminal in the light emitting thyristor LT rises. In this respect, in the equivalent circuit 66, when the potential at the gate terminal becomes equal to or greater than the high-level voltage at the data terminal D in the driving circuit (not illustrated), the gate current Ig flowing from the data terminal D to the gate terminal of the light emitting thyristor LT can be made substantially equal to 0 amperes. In the light emitting thyristor LT, thus, the cathode current Ik substantially as large as the anode current Ia flows through the cathode terminal. The light emitting thyristor LT, therefore, enters completely into the ON state, that is to say, the light emitting state.

Figure 8C:
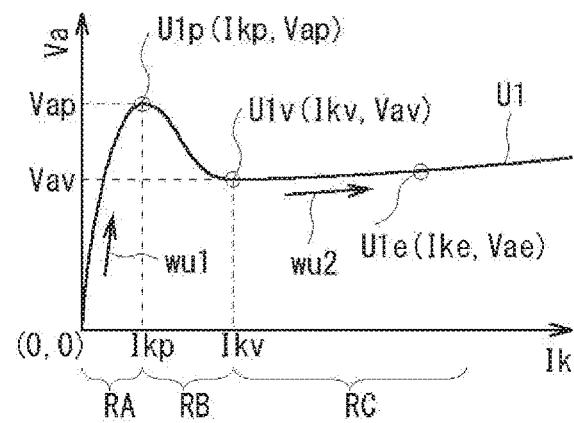

In this respect, let us graph a relationship between the cathode current Ik (FIG. 8B) in the light emitting thyristor LT and the anode-cathode voltage Va (FIG. 8A) in the light emitting thyristor LT. The graph can represent the relationship as a characteristic curve U1 drawn in FIG. 8C. In FIG. 8C, the coordinates (0, 0), that is to say, the origin of the coordinate system given represents the state in which: the light emitting thyristor LT emit no light; and the cathode electrode Ik is substantially equal to 0 amperes.

Once the light emitting thyristor LT starts to turn on, the cathode current Ik increases to reach a current Ikp in the equivalent circuit 66. Furthermore, in the equivalent circuit 66, the potential at the cathode terminal decreases, and the anode-cathode voltage Va rises to reach a voltage Vap. A point on the characteristic curve U1 which is represented by the coordinates (Ikp, Vap) is defined as a characteristic point U1p. To put it specifically, as indicated with an arrow wu1, the characteristic curve U1 starts at the origin (0, 0) when the light emitting thyristor LT starts to turn on, and continues drawing a curve at a relatively steep inclination angle, eventually reaching the characteristic point U1p whose coordinates are (Ikp, Vap).

In the equivalent circuit 66, once the voltage Vap is applied to between the anode terminal and the cathode terminal, the gate current Ig flows. The gate current Ig is as large as the base current Ib of the NPN transistor 68. In addition, the characteristic point U1p in FIG. 8C where the anode-cathode voltage Va is equal to the voltage Vap corresponds to a boundary between an OFF region RA and an ON transition region RB in a cathode current Ik-axis direction. The OFF region RA is a region in which the light emitting thyristor LT is in the non-light emitting state. Meanwhile, the ON transition region RB is a region in which the light emitting thyristor LT is in transition from the non-light emitting state to the light emitting state.

After that, in the equivalent circuit 66, the cathode current Ik increases from the current Ikp to reach a current Ikv, while the anode-cathode voltage Va decreases to reach a voltage Vay. In this respect, a point on the characteristic curve U1 which is represented by the coordinates (Ikv, Vav) is defined as a characteristic point U1v. The characteristic point U1v corresponds to a boundary between the ON transition region RB and an ON region RC in the cathode current Ik-axis direction. The ON region RC is a region in which the light emitting thyristor LT is in the light emitting state. On this occasion, in the equivalent circuit 66, the gate current Ig decreases substantially to 0 amperes, and the condition is practically the same as that which occurs when the data terminal D of the driving circuit (not illustrated) is disconnected from the gate terminal of the light emitting thyristor LT.

Subsequently, in the equivalent circuit 66, the cathode current Ik further increases from the current Ikv to reach a current Ike, while the anode-cathode voltage Va again increases to reach a voltage Vae, as indicated with an arrow wu2. A point on the characteristic curve U1 which is represented by the coordinates (Ike, Vae) is defined as a characteristic point U1e. This characteristic point U1e is a final operation point of driving the light emitting thyristor LT to emit light. On this occasion, the current Ike equal to the driving current supplied from the driving circuit (not illustrated) (corresponding to the current Iout in FIG. 4) flows in the light emitting thyristor LT, and the light emitting thyristor LT emits light with a predetermined light intensity.

Figure 8D:
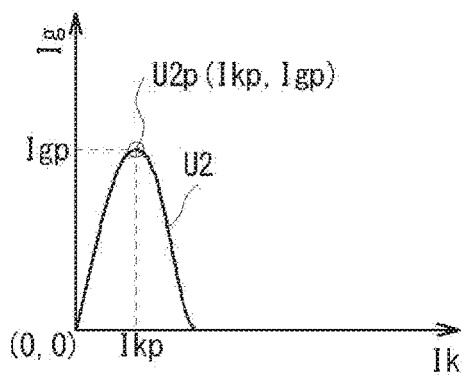

Furthermore, FIG. 8D corresponds to FIG. 8C, and represents a characteristic curve U2 obtained by graphing the relationship between the cathode current Ik and the gate current Ig in the light emitting thyristor LT. In the equivalent circuit 66, once the light emitting thyristor LT starts to turn on, the cathode current Ik increases and the gate current Ig increases as well.

Subsequently, in the equivalent circuit 66, when the cathode current Ik reaches the current Ikp, the gate current Ig reaches a current Igp. Thereafter, the cathode current Ik continues increasing, while the gate current Ig decreases. The characteristic curve U2, therefore, draws a curve which has a peak when the cathode current Ik is equal to the current Ikp and the gate current Ig is equal to the current Igp.

As discussed above, the light emitting thyristor LT is designed to perform the turn-on operation by: simply increasing the cathode current Ik; alternately increasing and decreasing the anode-cathode voltage Va; and increasing and thereafter decreasing the gate current Ig.

(1-4. Configuration of Print Head)

Figure 9:
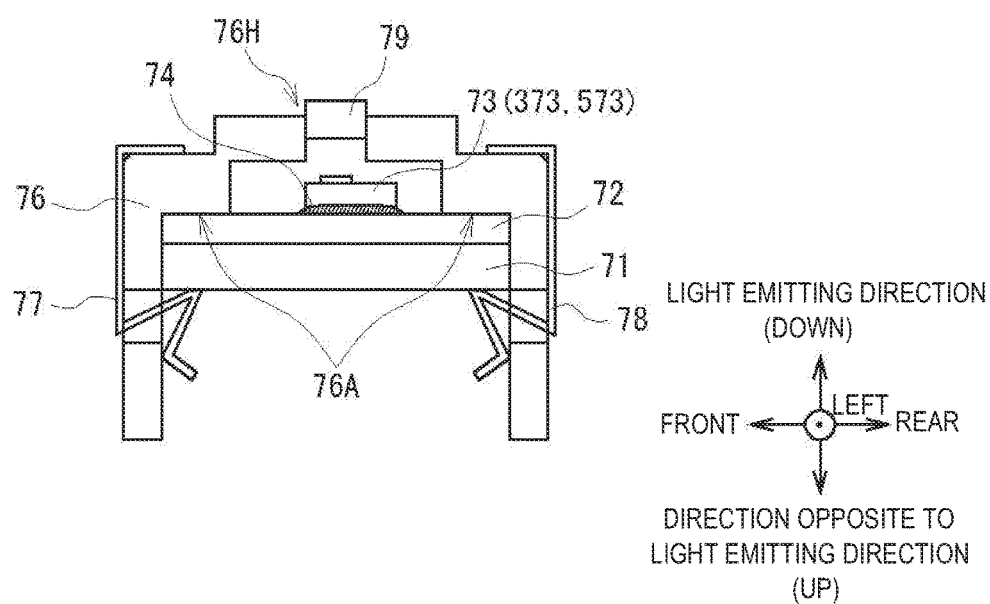
FIG. 9 is a schematic diagram illustrating a configuration of the print head.

Referring to FIG. 9, descriptions are provided for the configuration of the print head 33. FIG. 9 is a schematic cross-sectional diagram of the print head 33. For the sake of explanatory convenience, FIG. 9 illustrates an image of the print head 33 which is obtained by half-turning the print head 33 illustrated in FIG. 2 on the sheet, that is to say, by turning the print head 33 illustrated in FIG. 2 upside down and back to front. In the following descriptions, the upward direction on the FIG. 9 is also referred to as a light emitting direction, while the downward direction on FIG. 9 is also referred to as a direction opposite to the light emitting direction.

The print head 33 is built around a base member 71. As a whole, the base member 71 is formed in the shape of a flat rectangular parallelepiped or plate. The front-rear length of the base member 71 is shorter than its left-right length, and its up-down length is shortest. The base member 71 has a sufficient strength. A printed wiring board 72 is provided on a light emitting direction side (that is to say, a lower side) of the base member 71. The left-right and front-rear lengths of the printed wiring board 72 are substantially equal to those of the base member 71, respectively. The up-down length of the printed wiring board 72 is slightly shorter than that of the base member 71. The printed wiring board 72 is made, for example, of glass epoxy resin. Predetermined circuit patterns are formed on the upper and lower surfaces of the printed wiring board 72, respectively.

Figure 10:
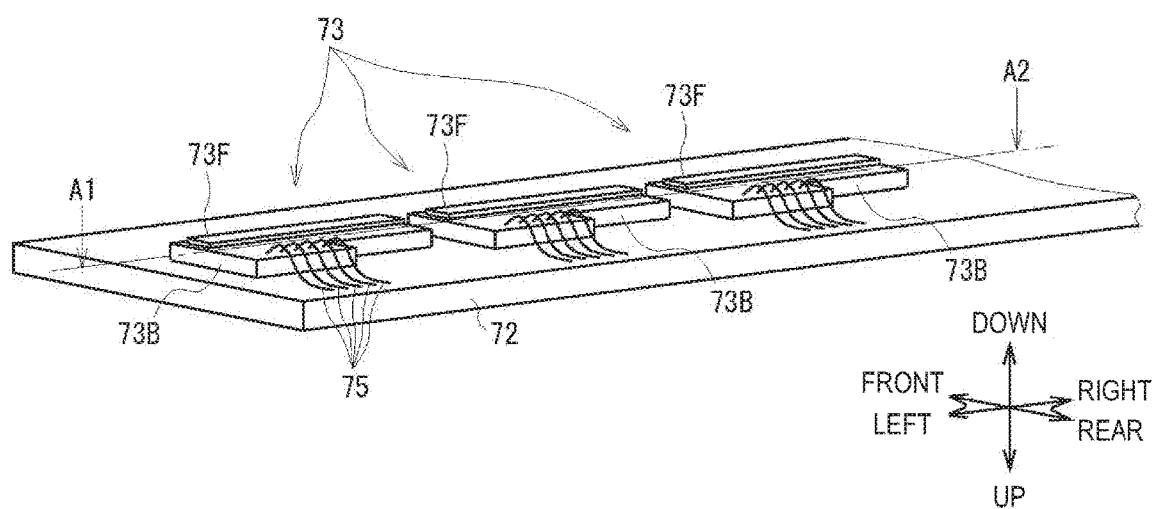
FIG. 10 is a schematic perspective diagram illustrating configurations of a printed wiring board and light emitting element chips.
Figure 11:
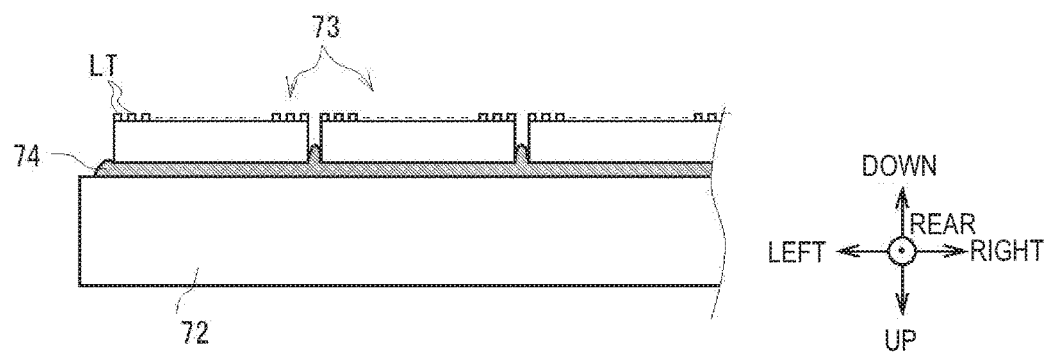
FIG. 11 is a schematic diagram illustrating how to mount light emitting element chips on the printed wiring board in a first embodiment.

As illustrated in a schematic perspective diagram of FIG. 10, and as illustrated in a schematic cross-sectional diagram of FIG. 11, many light emitting element chips 73, for example 26 light emitting element chips 73, are bonded to the light emitting direction side of the printed wiring board 72 using a paste 74. The light emitting element chips 73 are arrayed on the printed wiring board 72 in a line in the left-right direction. Incidentally, FIG. 11 is a cross-sectional diagram of the printed wiring board 72 and the light emitting element chips 73 taken along the A1-A2 line of FIG. 10.

In each light emitting element chip 73 as a driven element chip, an epitaxial film 73F, which is elongated in the left-right direction and short in the up-down direction (that is to say, thin), is attached to a light emitting direction-side (that is to say, lower) surface of a plate-shaped chip substrate 73B. For the sake of explanatory convenience, the left-right direction is hereinafter also referred to as an array direction, and the front-rear direction intersecting the left-right direction is hereinafter also referred to as an intersecting direction.

Many light emitting thyristors LT, for example, 192 light emitting thyristors LT, are formed on the epitaxial film 73F as an element film. The light emitting thyristors LT are arrayed on the epitaxial film 73F in the left-right direction.

The epitaxial film 73F is electrically connected to the chip substrate 73B by: bonding the epitaxial film 73F to the top surface (hereinafter also referred to as an array surface) of the chip substrate 73B, for example, using an epitaxial film bonding method disclosed in Japanese Patent Application Publication No. 2007-81081; and thereafter interconnecting together the connecting terminals provided to the epitaxial film 73F and the chip substrate 73B through photolithography. For the sake of explanatory convenience, each light emitting thyristor LT is hereinafter also referred to as a driven element, and light emitting thyristors LT gathered in a group are hereinafter also referred to as a driven element group.

As discussed above, the 26 light emitting element chips 73 are arrayed on the printed wiring board 72, and the 192 light emitting thyristors LT are provided to each light emitting element chip 73. A combined total of 4992 light emitting thyristors LT are provided to the printed wiring board 72. In addition, for example, the left-right length of the print head 33 (FIGS. 2 and 4) is substantially equal to the length (210 mm) of the short side of an A4-size sheet, and the 4922 light emitting thyristors LT are arranged in this length range at equal intervals. This makes it possible for the print head 33 to generate an electrostatic latent image with a resolution of 600 dpi on the circumferential surface of the photosensitive drum 38 (FIG. 2).

It should be noted that from a viewpoint of generating an electrostatic latent image with a certain resolution, it is desirable that in the print head 33, an interval between two light emitting thyristors LT adjacent to each other across a boundary part between each two adjacent light emitting element chips 73 be equal to an interval between each two adjacent light emitting thyristors LT in each light emitting element chip 73. To this end, in each light emitting element chip 73, distances from the left and right ends of the chip substrate 73B to the left and right endmost light emitting thyristors LT are very short, respectively.

In addition, each above-discussed drive controlling circuit 50 (FIG. 4) is designed to drive a group of 192 light emission driving circuits LDC provided to a corresponding light emitting element chip 73 in a time-division way. In order to meet this design requirement, the controller 3 is provided with 26 drive controlling circuits 53 which are equal in number to the light emitting element chips 73. Each drive controlling circuit 50 drives the light emission driving circuits LDC on the corresponding light emitting element chip 73 in parallel. Incidentally, for the sake of explanatory convenience, FIG. 4 illustrates only one drive controlling circuit 50, and omits the other drive controlling circuits 50.

Terminal pads are provided on the light emitting direction-side (that is to say, lower) surface of each light emitting element chip 73 (FIG. 10), and are electrically connected to the printed wiring board 72 via bonding wires 75.

Furthermore, in the print head 33 (FIG. 9), the base member 71 and the printed wiring board 72 are attached to a holder 76. The holder 76 as a whole has a shape of a hollow quadrangular prism formed extending in the left-right direction, but excluding its side surface facing in the direction opposite to the light emitting direction. The cross section of the holder 76 is shaped like the capital letter U turned upside down, and is opened in the direction opposite to the light emitting direction.

Support portions 76A which support the printed wiring board 72 are formed on a light emitting direction-side inner surface of the holder 76. When the print head 33 is manufactured, the printed wiring board 72 and the base member 71, as stacked together, are inserted into the holder 76, and clamp members 77, 78 are attached to the print holder 76. The clamp members 77, 78 both are made of metal. Due to their elastic force effect, the clamp members 77, 78 fix the printed wiring board 72 to the holder 76 with the light emitting direction-side surface of the printed wiring board 72 in contact with the support portions 76A of the holder 76, and with the base member 71 interposed between the clamp members 77, 78 and the printed wiring board 72. This determines the positional relationship between the holder 76 and the light emitting elements on the light emitting element chips 73 mounted on the printed wiring board 72.

An attachment hole 76H is formed near the center of a light emitting direction-side portion of the holder 76. The attachment hole 76H is a hole elongated in the left-right direction, and penetrates through the light emitting direction-side portion of the holder 76 in the up-down direction. A rod lens array 79 is attached to the attachment hole 76H. The rod lens array 79 includes microlenses each with the optical axis extending in the up-down direction which are arranged in the left-right direction. The rod array lens 79 is fixed to the attachment hole 76H with its attachment position adjusted such that the focal points of the microlenses are on the light emitting thyristors LT on the light emitting element chips 73.

(1-5. Configuration of Light Emitting Element Chip)

Figure 12:
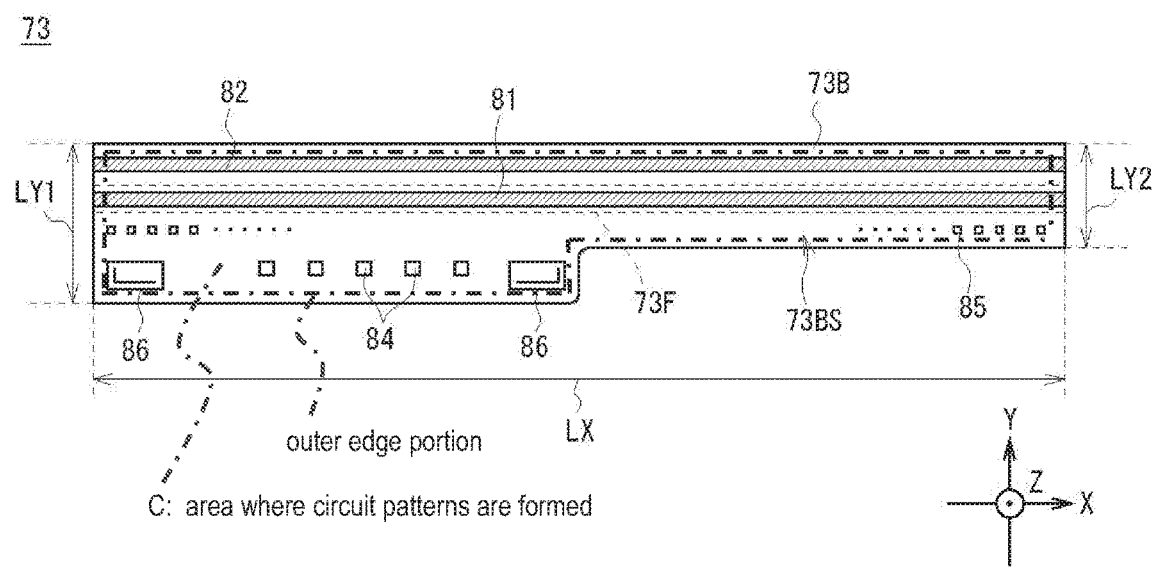
FIG. 12 is a schematic diagram illustrating a configuration of the light emitting element chip.

Next, descriptions are provided for the light emitting element chip 73. As illustrated in a schematic plan view in FIG. 12, the light emitting element chip 73 as a whole is formed in the shape of a rectangle which is long in an X direction corresponding to the horizontal direction on FIG. 12, and which is short in a Y direction corresponding to the vertical direction on FIG. 12. Furthermore, for the sake of explanatory convenience, a direction from the back to the front of FIG. 12 is referred to as a Z direction.

The light emitting element chip 73 is of a self-scanning type. Roughly speaking, the light emitting element chip 73 includes, among other things, the plate-shaped chip substrate 73B and the film-shaped epitaxial film 73F, as discussed above. The chip substrate 73B is a semiconductor whose main material is, for example, silicon. The epitaxial film 73F is pasted to a chip substrate surface 73BS, that is to say, the light emitting direction-side surface of the chip substrate 73B. Furthermore, conductive layers are formed in the inside of the chip substrate 73B, but near the chip substrate surface 73BS. In each conductive layer, a predetermined circuit pattern is made of a conductive material (although later described in detail).

When viewed in the Z direction, the chip substrate 73B as a whole is formed in the shape of a rectangle. A rectangular portion of the rectangle-shaped chip substrate 73B near a corner facing both in the X direction and in the −Y direction is cut away from the rest of the chip substrate 73B. In other words, in the chip substrate 73B, a long side facing in the Y direction extends in a straight line, while the other long side facing in the −Y direction curves in the shape of a crank. For the sake of explanatory convenience, the length of the long side of the chip substrate 73B is equal to a length LX, the length of a longer short side of the chip substrate 73B is equal to a length LY1, and the length of a shorter short side of the chip substrate 73B is equal to a length LY2.

The light emitting element chip 73 is provided with a light emitting element group 81 as the driven element group, and a driving circuit group 82. The light emitting element group 81 includes the 192 light emitting thyristors LT (FIG. 4) which are provided on the above-discussed epitaxial film 73F. The light emitting thyristors LT included in the light emitting element group 81 are arrayed in a straight line in the X direction, and over substantially all of the chip substrate surface 73BS in the X direction at equal intervals.

The driving circuit group 82 has a configuration in which the driving circuits for driving the respective light emitting thyristors LT, that is to say, the flip flops FF and the gate driving circuits GD (FIG. 4), are arrayed in a straight line in the X direction. The driving circuit group 82 corresponds to the shift register 33R illustrated in FIG. 4. Furthermore, the chip substrate 73B is provided with things such as: terminal pads 84 each functioning as an electrode; micro via lines 85 for connecting the chip substrate surface 73BS and the circuit patterns in other layers; and a position mark 86 used to align the positions of the chip substrate 73B of its own and the neighboring chip substrates 73B.

(1-6. Manufacturing of Light Emitting Element Chip)

Figure 13A:
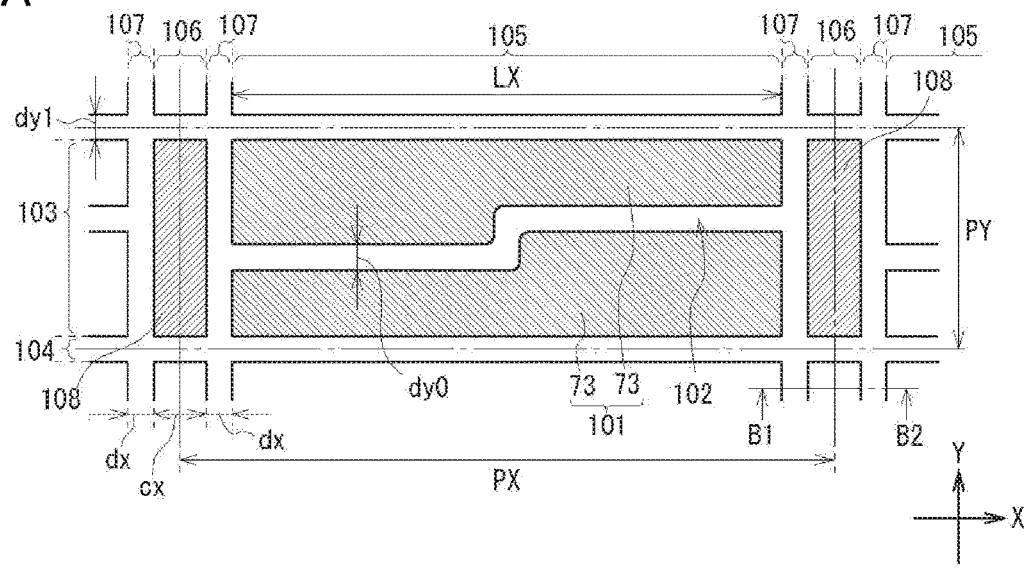
FIGS. 13A to 13C are schematic diagrams illustrating a configuration of a semiconductor wafer according to the first embodiment.

Next, descriptions are provided for how to manufacture the light emitting element chip 73. FIG. 13A is a magnified diagram of a part of the light emitting element chip 73. As illustrated in FIG. 13A, the light emitting element chips 73 (chip substrate portions 73) are manufactured based on a semiconductor wafer 100 made of silicon or the like, like well-known semiconductor chips, integrated circuits and the like. Many light emitting element chips 73 is manufactured arranged on the semiconductor wafer 100, using well-known exposure techniques, etching techniques and the like. Incidentally, the thickness of the semiconductor wafer 100, that is to say, a Z-direction length thereof, is approximately 600 μm, for example.

(1-6-1. Placement of Parts in Semiconductor Wafer)

To put it specifically, pairs of light emitting element chips 73 are placed on the semiconductor wafer 100 with the Y-direction projecting part of one light emitting element chip 73 in each pair entering the cut in the other light emitting element chip 73 in the same pair which overturns on the XY plane. For the sake of explanatory convenience, each pair of light emitting element chips 73 is hereinafter referred to as a light emitting element chip pair 101. Incidentally, a chip pair clearance 102 having a Y-direction length dy0 is formed between the two light emitting element chips 73 included in each light emitting element chip pair 101.

In addition, on the semiconductor wafer 100, light emitting element chip pairs 101 are arranged in a matrix by being arrayed at intervals of a length PX in the X direction, and at intervals of a length PY in the Y direction. In this respect, on the semiconductor wafer 100, as for the Y direction, the light emitting element chip pairs 101 are formed respective in Y chip regions 103. A Y clearance region 104 is formed between each two neighboring Y chip regions 103. The Y-direction length of each Y chip region 103 is equal to a combined total of the lengths LY1, LY2, dy0. A length dy1 of the Y clearance region 104 is substantially equal to the length dy0 of the chip pair clearance 102. Incidentally, the length PY is equal to a combined total of the lengths LY1, LY2, dy0, dy1.

Meanwhile, on the semiconductor wafer 100, as for the X direction, the light emitting element chip pairs 101 are formed respectively in X chip regions 105. An X extra piece region 106 is formed between each two neighboring X chip regions 105. In addition, an X clearance region 107 is formed between the X chip region 105 and the X extra piece region 106.

The X-direction lengths of the regions on the semiconductor wafer 100 are as follows. The X-direction length of the X chip region 105 has a length LX which is equal to the X-direction length of the light emitting element chip 73 (FIG. 12). The X-direction length of the X extra piece region

106 has a length cx which is sufficiently shorter than the length LX. The X-direction length of the X clearance region 107 has a length dx which is substantially equal to the lengths dy0, dy1.

Figure 13B:
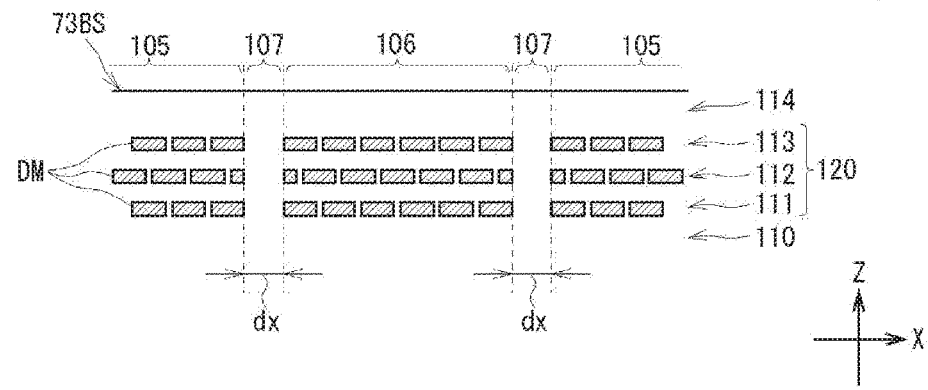

FIG. 13B illustrates a cross-sectional diagram of a part of the semiconductor wafer 100 taken along the B1-B2 line. As illustrated in FIG. 13B, conductive layers are formed in the inside of the semiconductor wafer 100, but near the chip substrate surface 73BS. To put it specifically, a first conductive layer 111, a second conductive layer 112, a third conductive layer 113, a passivation protecting film 114 and a base layer 110 are formed in the semiconductor wafer 100 such that: the base layer 110 is located further outward in a −Z direction than the other layers; and the other layers are stacked one after another on the base layer 110 in the Z direction in this order.

It should be noted that a nonconductive insulating layer is formed between the first conductive layer 111 and the second conductive layer 112, as well as between the second conductive layer 112 and the third conductive layer 113. Like the base layer 110, this insulating layer is made mainly of silicon.

The first, second and third conductive layers 111, 112, 113 (hereinafter generically referred to as conductive layers 120 as well) are made of a conductive metal material such as aluminum (Al). As described above, a predetermined circuit pattern (hereinafter also referred to as an interconnect section) to be connected to the light emitting thyristors LT and the like is formed in each conductive layer 120.

In addition to this, dummy metals DM are arranged in part of each conductive layer 120 where the circuit pattern is not formed, depending on the necessity. For example, the part of each conductive layer 20 where the circuit pattern is not formed is an outer edge portion of the light emitting element chip 73. In an embodiment, the dummy metals DM are provided at each of both longitudinal end portions of the light emitting element chip 73. Each dummy metal DM as a dummy conductor is formed, for example, in the form of a micro-sized cuboid, and is made of the same material as the circuit pattern is made. The Z-direction length (that is to say, the thickness) of the dummy metal DM is equal to that of the circuit pattern. Furthermore, the dummy metals DM are electrically disconnected from the circuit pattern.

FIG. 18C is a schematic plan diagram of the third conductive layer 113. As illustrated in FIG. 18C, in the third conductive layer 113 in the semiconductor wafer 100, for example, like bricks or tiles, dummy metals DM are arranged substantially in the shape of a lattice on the XY plane with small clearances among the dummy metals DM. Incidentally, the dummy metals DM are arranged such that positions of clearances between dummy metals DM sitting next to each other in one line extending in the Y direction are offset from positions of clearances between dummy metals DM sitting next to each other in a neighboring line extending in the Y direction by half a pitch, that is to say, are staggered.

Furthermore, like in the third conductive layer 113, in the second conductive layer 112 and the first conductive layer 111 in the semiconductor wafer 100, dummy metals DM are arranged substantially in the shape of a lattice. Incidentally, in the semiconductor wafer 100, as illustrated in FIG. 13B, dummy metals DM are arranged such that clearances of dummy metals DM sitting next to each other in a line in one conductive layer 120 are offset from clearances of dummy metals DM sitting next to each other in a line in a neighboring conductive layer 120 by half a pitch both in the X direction and in the Y direction, like in a general case of piling bricks.

Figure 18A:
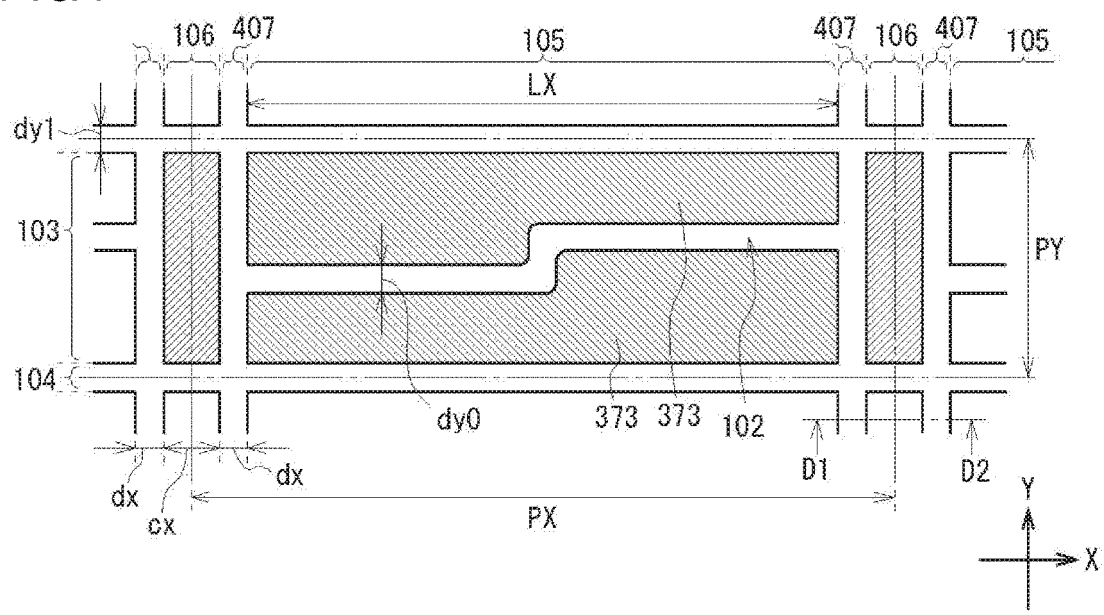
FIGS. 18A and 18B are schematic diagrams illustrating a configuration of a semiconductor wafer according to a second embodiment.
Figure 18B:
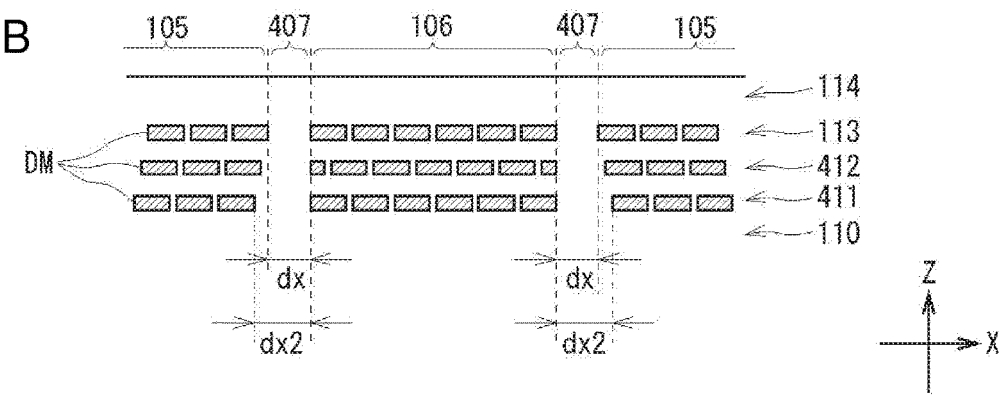

Furthermore, as illustrated in FIGS. 18B and 18C, the semiconductor wafer 100 is designed such that no dummy metal DM is arranged in parts of each conductive layer 120 which serve as boundaries between the light emitting element chips 73, that is to say, parts thereof which serve as the chip pair clearances 102, the Y clearance regions 104 and the X clearance regions 107. In other words, in the semiconductor wafer 100, the dummy metals DM are arranged in each conductive layer 120, without their overlapping: the circuit pattern formed in the conductive layer 120; the chip pair clearances 102; the Y clearance regions 104; or the X clearance regions 107. In addition, as for the X direction, the dummy metals DM facing the boundaries between the X chip regions 105 and the X clearance regions 107 are arranged in the semiconductor wafer 100 such that the side surfaces of the dummy metals DM are aligned with the boundaries. Each X clearance region 107, therefore, can extend in the −Z direction inside the semiconductor wafer 100 from the surface of the semiconductor wafer 100, through the material made mainly of silicon, along the side surfaces of such dummy metals DM, without being interrupted by the metal materials in each conductive layer 120.

(1-6-2. Dicing of Light Emitting Element Chips)

Next, descriptions are provided for a step of dividing (that is to say, separating) the semiconductor wafer 100 into light emitting element chips 73 by dicing the semiconductor wafer 100. In this embodiment, the semiconductor wafer 100 is separated into light emitting element chips 73 using an etching process by combining a method disclosed in Japanese Patent Application Publication No. 2004-193241, and detailed information disclosed in Japanese Patent Application Publication No. 2004-296474.

Patent Document 2: Japanese Patent Application Publication No. 2004-193241

Patent Document 3: Japanese Patent Application Publication No. 2004-296474

To put it specifically, to begin with, the flip flops FF and the gate driving circuits GD of the shift register 33R (FIG. 4), as well as the circuit patterns, the dummy metals DM and the like are formed on and in the semiconductor wafer 100, using well-known exposure techniques, etching techniques and so on. Thereafter, on the semiconductor wafer 100, the epitaxial films 73F each with the light emitting thyristors LT and the like formed thereon are attached to each chip substrate 73B using the method disclosed in Japanese Patent Application Publication No. 2007-81081. Subsequently, the terminals of the light emitting thyristors LT and the terminals of the chip substrate 73B are interconnected together through photolithography. In other words, each light emitting element chip 73 is formed as a composite chip which includes the light emitting elements and the driving elements.

After that, grooves are formed in parts of the semiconductor wafer 100 which serve as the boundaries among the light emitting element chips 73, that is to say, parts thereof which serve as the chip pair clearances 102, the Y clearance regions 104 and the X clearance regions 107 (FIG. 13A and the like). The depth of the grooves is approximately 300 μm, extending in the −Z direction from the Z direction side of the semiconductor wafer 100. In this respect, the grooves are formed, for example, by deep reactive ion etching (DRIE) which is a type of etching process, for example, without using cutters or the like which rotate their respective thin disk-shaped blades at high speed. This DRIE uses two types of processes, "etching mode" and "passivation mode," to form the grooves.

It should be noted that resist films are beforehand formed on the semiconductor wafer 100, except for the parts of semiconductor wafer 100 which serve as the boundaries among the light emitting elements chips 73 (that is to say, the X clearance regions 107 and the like; hereinafter also referred to as chip boundary parts). In addition, the semiconductor wafer 100 is placed between the parallel plate electrodes inside the chamber of a RIE system (not illustrated).

Figure 14A:
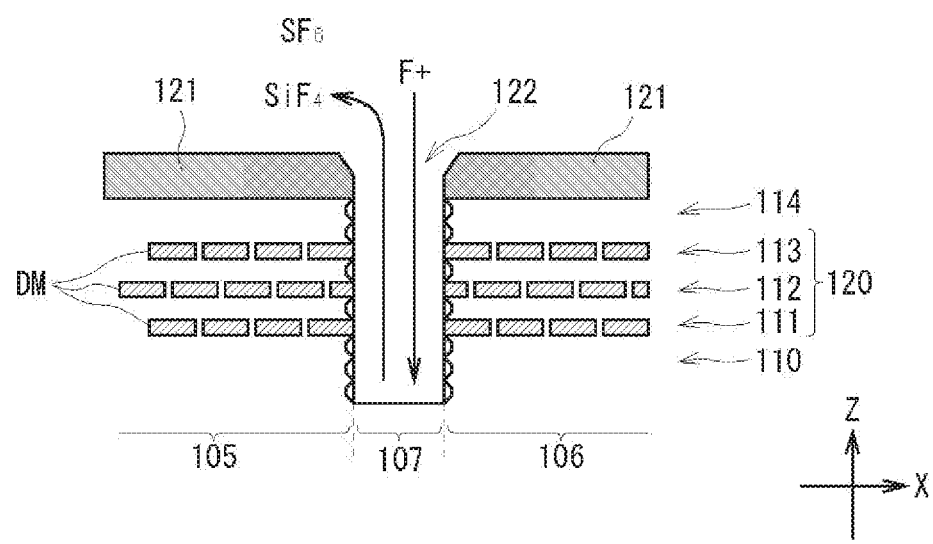
FIGS. 14A and 14B are schematic diagrams illustrating how a groove is formed by DRIE.

FIG. 14A is a schematic diagram corresponding to the FIG. 13B. As illustrated in the schematic diagram, in the etching mode, a sulfur fluoride gas ($SF_6$) is supplied into the chamber, and this $SF_6$ is ionized to turn into plasma. Thereby, in the semiconductor wafer 100, radicalized positive fluoride ions etch the silicon (Si) surfaces of the bottom portions of the chip boundary parts 122 on which no resist film 121 is formed. In exchange, $SiF_4$ is discharged from the semiconductor wafer 100.

In the semiconductor wafer 100, no dummy metal DM is arranged in portions of each chip boundary part 122 whose depths correspond to the conductive layers 120 (FIG. 13). During the etching mode, therefore, the etching progress can deepens the groove in the −Z direction without being interrupted by dummy metals DM. Furthermore, in the semiconductor wafer 100, no radicalized positive fluoride ions react on the metal materials of the conductive layers 120. Thus, once in each conductive layer 120, the side surfaces of the dummy metals DM are exposed from the side surface potions of the chip boundary part 122, the exposure stops the progress in the etching in the X direction and in the Y direction. The etching process, therefore, is performed on the semiconductor wafer 100 in such a way that the bottom portion of each chip boundary part 122 is etched to make the groove deeper with the side surfaces of the dummy metals DM forming the inner side surface of the groove.

Figure 14B:
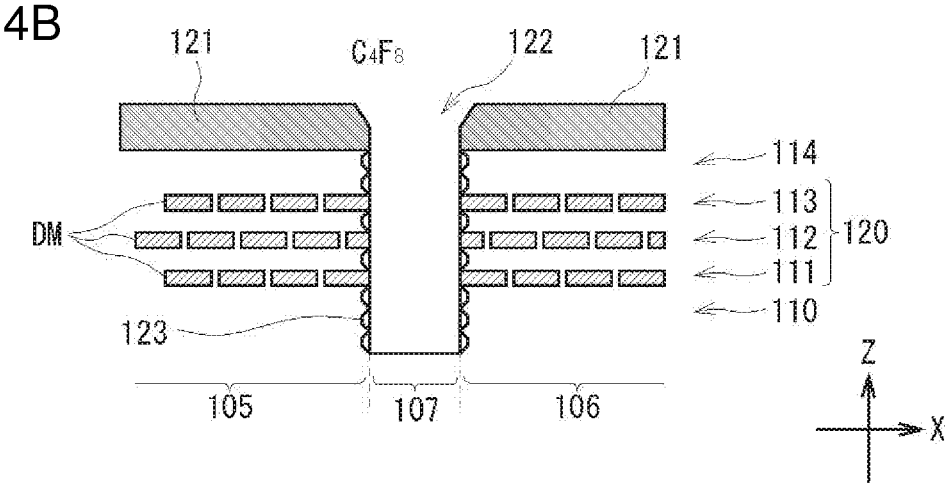

FIG. 14B is a schematic diagram corresponding to FIG. 14A. As illustrated in the schematic diagram, in the passivation mode, a $C_4F_8$ gas is supplied into the chamber. Thereby, in the semiconductor wafer 100, a deposition layer 123 of a freon polymer, a polymeric substance, is formed on the surface (that is to say, the inner side surface) of each groove.

Figure 15:
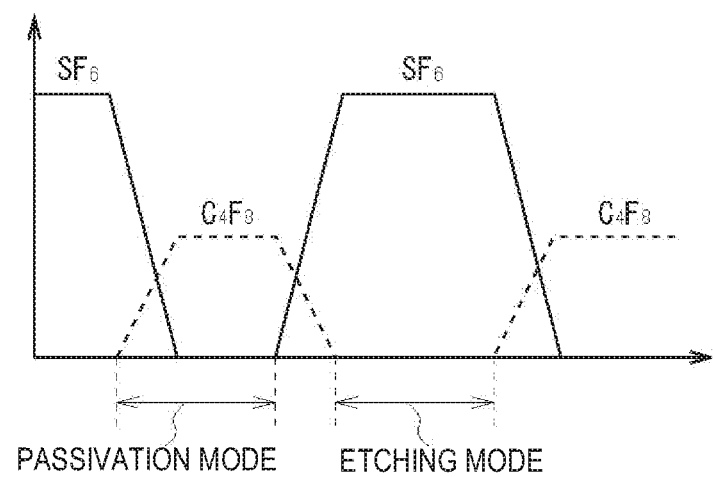
FIG. 15 is a schematic diagram illustrating how amounts of gases supplied in DRIE change with time.

FIG. 15 illustrates temporal changes in amount of the supplied gases. As illustrated in FIG. 15, during the DRIE, the etching mode to supply $SF_6$ and the passivation mode to supply $C_4F_8$ are alternately repeated. Thereby, in the semiconductor wafer 100, the deepening of each groove by the etching mode, and the protection of the surface of the groove by the passivation mode are alternately repeated to eventually form the groove with a sufficient depth in the chip boundary part 122.

Thereafter, a predetermined adhesive film is stuck to the front surface side (that is to say, the Z direction side) of the semiconductor wafer 100, and the opposite side (that is to say, the −Z direction side) of the semiconductor wafer 100 is etched. Thereby, the semiconductor wafer 100 is divided into the light emitting element chips 73 along the chip boundary parts 122. That is to say, the semiconductor wafer 100 is diced.

As illustrated in FIGS. 14A and 14B, the side surface portions of the dummy metals DM are exposed from side surfaces of each diced light emitting element chip 73 which face respectively in the X direction and in the −X direction. The exposed side surface portions of the dummy metals DM (hereinafter also referred to as chip substrate side surfaces) are just the side surface portions of the dummy metals MD formed in the semiconductor wafer 100 by the processing process.

It should be noted that the dicing not only divides the semiconductor wafer 100 into the light emitting element chips 73, but also separates extra piece chips 108 (FIG. 13A) from portions of the semiconductor wafer 100 where the Y chip regions 103 and the X extra piece regions 106 cross each other.

(1-7. Working and Effects)

In the first embodiment, with the above-discussed configuration, the light emitting element chips 73 to be mounted on the print head 33 of the image forming apparatus 1 are manufactured based on the semiconductor wafer 100 using the semiconductor process.

Figure 13C:
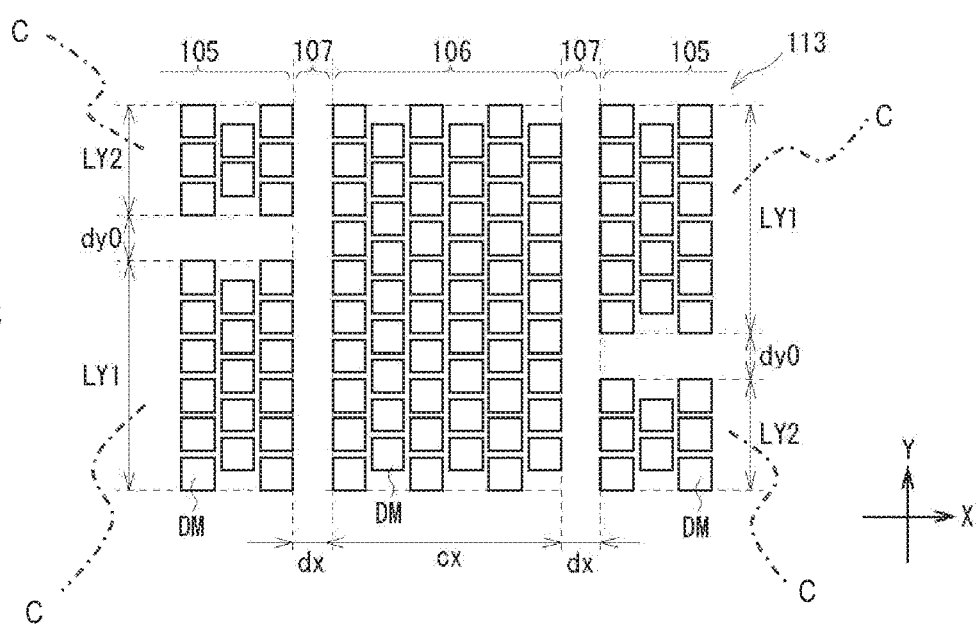
Figure 16A:
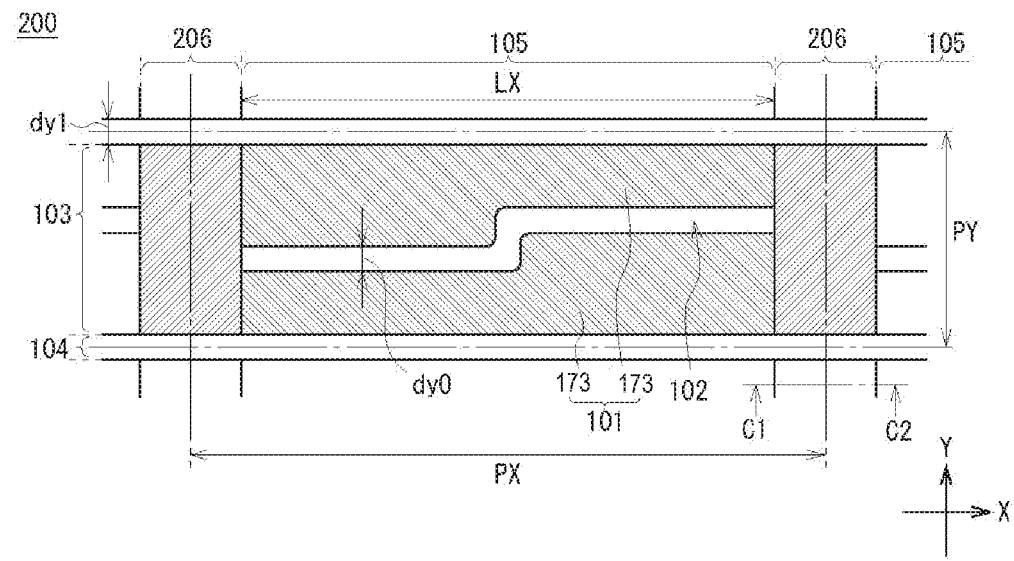
FIGS. 16A to 16C are schematic diagrams illustrating a configuration of an imaginary semiconductor wafer.
Figure 16B:
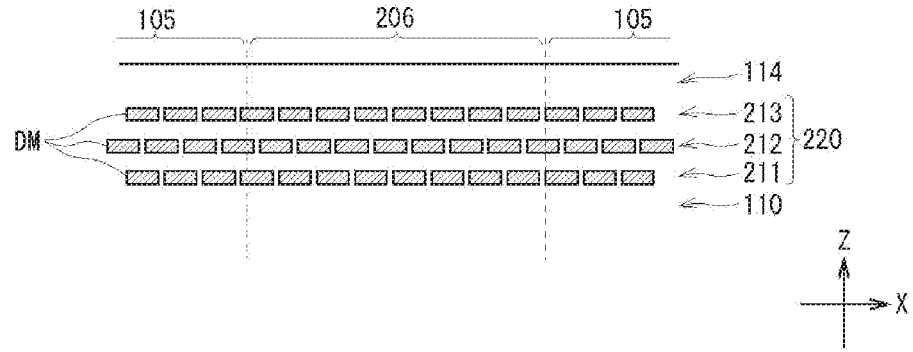
Figure 16C:
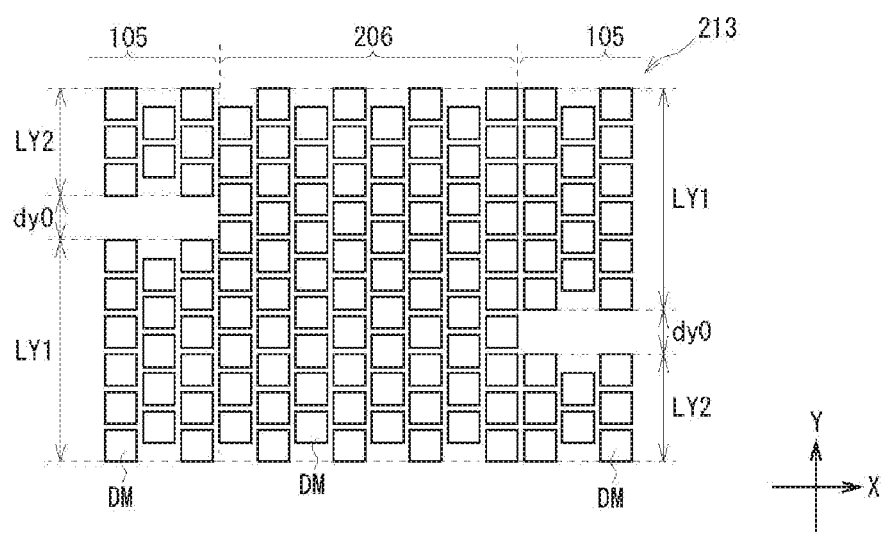

For the purpose of comparison with this embodiment, let us assume imaginary light emitting element chips 173 and an imaginary semiconductor wafer 200 to be used to manufacture the imaginary light emitting element chips 173, as illustrated in FIGS. 16A, 16B and 16C corresponding to FIGS. 13A, 13B and 13C. Incidentally, FIG. 16B is a cross-sectional diagram of the imaginary semiconductor wafer 200 taken along the C1-C2 line of FIG. 16A.

In many respects, this semiconductor wafer 200 has the same configuration as the semiconductor wafer 100. The semiconductor wafer 200, however, is provided with no X extra piece region 106 or no X clearance region 107. Instead, X extra piece regions 206 are formed in the semiconductor wafer 200. Furthermore, as illustrated in FIG. 16C, in the semiconductor wafer 200, as for X direction, no boundaries are provided between the X chip regions 105 and the X extra piece regions 206, and the dummy metals DM are continuously arranged.

Figure 17:
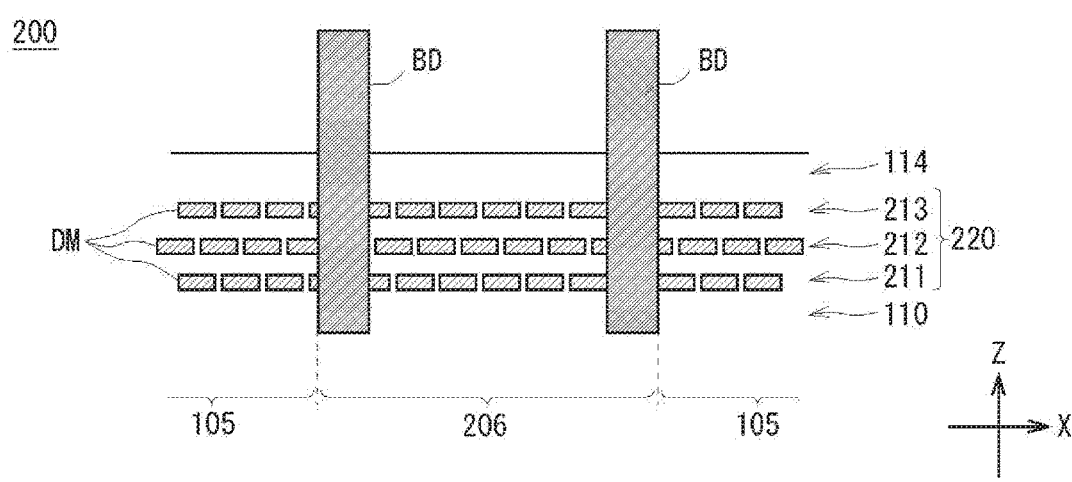
FIG. 17 is a schematic diagram illustrating how dicing is performed using a cutter blade.

In the semiconductor wafer 200, grooves are formed in each chip pair clearance 102 and each Y clearance region 104. Meanwhile, as illustrated in FIG. 17, grooves are formed along the short sides of the each light emitting element chip 173 using cutters which rotate the respective thin disk-shaped blades BD at high speed. In the semiconductor wafer 200, therefore, the metal materials forming the dummy metals DM can be cut in addition to the silicon. In the semiconductor wafer 200, however, there is likelihood that each cutter blade BD wobbles in a direction to which the surface of the disk faces, that is to say, in the X direction. This wobble is likely to decrease the precision of the place in which to form the groove in the X direction, and to vary distances from the short sides of each divided light emitting element chip 173 to the light emitting thyristors LT next to the short sides.

Thus, in the print head 33 on which the light emitting thyristors LT are mounted, an interval between the neighboring light emitting thyristors LT across the boundary between each two adjacent light emitting element chips 173 are unequal to one another. This causes a risk that the image quality of a formed electrostatic latent image decreases to a large extent. Furthermore, a relatively large margin has to be set for the light emitting element chips 173. There is a risk that the resolution of the electrostatic image cannot be increased.

What is more, it is theoretically possible that the grooves are formed in the semiconductor wafer 200 using DRIE like when the semiconductor wafer 100 is formed Since, however, in the semiconductor wafer 200, the dummy metals DM are continuously arranged over the X chip regions 105 and the X extra piece regions 206 in the X direction, the semiconductor wafer 200 needs to be etched using a gas changed corresponding to the metal material, and a resist film corresponding to this gas needs to be formed on the semiconductor wafer 200 in advance. The use of DRIE, therefore, is likely to increase the number of steps to a large extent, and to push up manufacturing costs to a large extent.

In contrast, the semiconductor wafer 100 according to this embodiment is designed such that no dummy metal DM is arranged in the X clearance regions 107 and the like which serve as the boundaries between the light emitting element chips 73 (FIG. 13). The semiconductor wafer 100, therefore, does not require parts of the metal material to be removed by DRIE etching, and enables the grooves with the sufficient depth to be formed through a relatively small number of steps.

Particularly in the semiconductor wafer 100, the grooves along the short side portions of the light emitting element chips 73 can be formed by etching with a position accuracy close to the semiconductor process rule (for example, 0.35 μm and the like). Thereby, in each light emitting element chip 73 manufactured from the semiconductor wafer 100, the distances from the left and right endmost light emitting thyristors LT to the left and right short sides can be made equal to the design value with very high accuracy. This makes it possible for the print head 33 with the light emitting element chips 73 mounted thereon (FIGS. 9 to 11, etc.) to generate an electrostatic latent image with such a very high quality that spaces between pixels are equal to one another with high accuracy. Moreover, the image forming apparatus 1 with this print head 33 installed therein can form an image with a very high quality.

In addition, in the semiconductor wafer 100 (FIG. 13), the grooves can be formed in the chip pair clearances 102, the Y clearance regions 104 and the X clearance regions 107 by DRIE at the same time. Thus, the light emitting element chips 73 can contribute to making the manufacturing system simpler, the number of steps smaller, the manufacturing costs lower, and the time required for the manufacturing shorter than the light emitting element chips 173 obtained by forming the grooves in the semiconductor wafer 200 using both etching and the cutters.

Furthermore, in the semiconductor wafer 100, the dummy metals DM are arranged except for in parts where the grooves, inclusive of the chip pair clearances 102, the Y clearance regions 104 and the X clearance regions 107, are formed, and except for parts where the circuit patterns are formed (FIGS. 13A, 13B and 13C). In each light emitting element chip 73 manufactured based on the semiconductor wafer 100, therefore, the flatness of the chip substrate surface 73BS can be increased to a large extent, and the epitaxial film 73F can be stably bonded to the chip substrate surface 73BS with high accuracy.

In other words, since the dummy metals DM are arranged clear of the X clearance regions 107 and the like which serve as the boundaries between the light emitting element chips 73, the light emitting element chips 73 make it possible to achieve the flatness of the chip substrate surfaces 73BS, and the forming of the grooves with the higher position accuracy by etching, at the same time with higher dimensions.

As for the image forming apparatus 1 according to the first embodiment, with the above-discussed configuration, in manufacturing the light emitting element chips 73 to be mounted on the print head 33, the dummy metals DM are arranged in the semiconductor wafer 100, clear of the X clearance regions 107 and the like which serve as the boundaries between the light emitting element chips 73. This makes it unnecessary to remove parts of the metal material from the semiconductor wafer 100 by DRIE, and therefore makes it possible to minimize the number of DRIE steps and the number of gases to be used for DRIE. This also makes it possible to form the sufficiently deep grooves with the very high position accuracy close to the process rule. The image forming apparatus 1 including the print head 33 with such light emitting element chips 73 mounted thereon, therefore, can form an image with a very high quality.

2. Second Embodiment

An image forming apparatus 301 (FIG. 1) according to a second embodiment is different from the image forming apparatus 1 according to the first embodiment in that the image forming apparatus 301 includes a print head 333 instead of the print head 33 (FIG. 2). In other respects, however, the image forming apparatus 301 has the same configuration as the image forming apparatus 1. The print head 333 is different from the print head 33 according to the first embodiment in that the print head 333 includes light emitting element chips 373 instead of the light emitting element chips 73 (FIG. 9). In other respects, however, the print head 333 has the same configuration as the print head 33.

As illustrated in FIGS. 18A and 18B corresponding to FIGS. 13A and 13B, the light emitting element chips 373 are manufactured based on a semiconductor wafer 400 instead of the semiconductor wafer 100. Incidentally, FIG. 18B is a cross-sectional diagram of the semiconductor wafer 400 taken along the D1-D2 line of FIG. 18A. The semiconductor wafer 400 has substantially the same configuration as the semiconductor wafer 100. The semiconductor wafer 400, however, is different from the semiconductor wafer 100 in that the semiconductor wafer 400 includes X clearance regions 407, a first conductive layer 411 and a second conductive layer 412 instead of the X clearance regions 107, the first conductive layer 111 and the second conductive layer 112.

Like the second conductive layer 112 (FIG. 13) according to the first embodiment, the second conductive layer 412 includes: the predetermined circuit pattern formed therein; and the dummy metals DM arranged therein clear of the circuit pattern, the X clearance regions 407 and the like. In the second conductive layer 412, however, each borderline between the X chip region 105 and the X clearance region 407, that is to say, the side surface portion of the dummy metal DM facing the borderline, is arranged offset to the center of the corresponding light emitting element chip 373, unlike in the case of the first conductive layer 111 which is located further outward in the light emitting direction than the second conductive layer 412. In other words, the X-direction width (length) of the X clearance region 407 in second conductive layer 412 is wider than the X-direction length dx of the corresponding X clearance region 107 in the first conductive layer 111.

Furthermore, each borderline between the X chip region 105 and the X clearance region 407, that is to say, the side surface portion of the dummy metal DM facing the borderline, is arranged more offset to the center of the corresponding light emitting element chip 373 in the first conductive layer 411 than in the second conductive layer 412. Specifically, the X-direction width (length) of the X clearance region 407 is wider in the first conductive layer 411 than in second conductive layer 412, and is equal to a length dx2. In other words, as illustrated in FIG. 18B, the X clearance region 407 is roughly shaped like a trapezoid in which: a side facing in the light emitting direction is shorter; and a side facing the direction opposite to the light emitting direction is longer.

Figure 19:
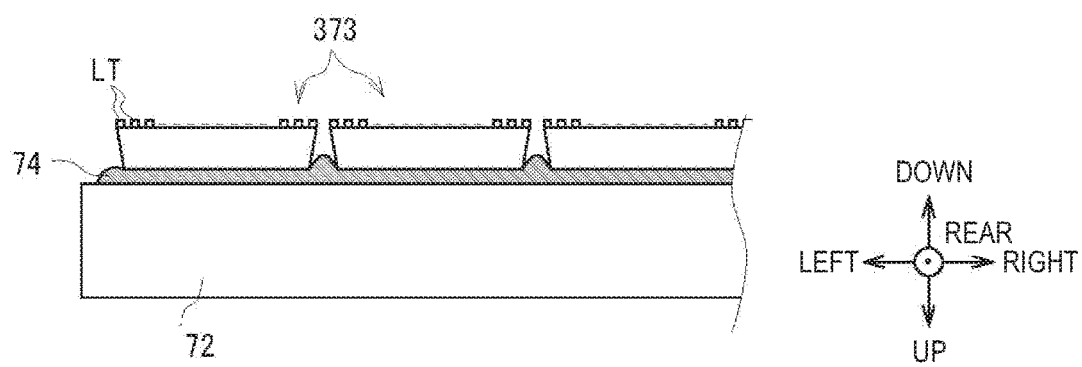
FIG. 19 is a schematic diagram illustrating how to mount light emitting element chips on a printed wiring board in the second embodiment.

Because of this, depending on the arrangement of the dummy metals DM in the second conductive layer 412 and the first conductive layer 411, the grooves are formed in the semiconductor wafer 400 by DRIE such that the X-direction width of the grooves is greater in the direction opposite to the light emitting direction than in the light emitting direction. As illustrated in a schematic cross-sectional diagram of FIG. 19 corresponding to FIG. 11, therefore, each light emitting element chip 373 diced from the semiconductor wafer 400 has the shape of a so-called overturned trapezoid in which a side facing in the direction opposite to the light emitting direction is shorter than a side facing in the light emitting direction.

On the print head 333 on which the light emitting element chips 373 are mounted, therefore, in a boundary part between each two neighboring light emitting element chips 373, a clearance with a sufficient volume can be formed between the light emitting element chips 373 while sufficiently narrowing spaces between the light emitting thyristors LT. If, therefore, an amount of paste 74 applied to the printed wiring board 72 is too much, it is possible to preclude the occurrence of a problem that part of the paste 74 goes up through the clearances between the light emitting element chips 373 in the light emitting direction to cover the light emitting thyristors LT.

In other respects, too, the light emitting element chips 373, the print head 333 and the image forming apparatus 1 including them according to the second embodiment can bring about the same working and effects as the those according to the first embodiment.

In the second embodiment, with the above-discussed configuration, in manufacturing the light emitting element chips 373, along each borderline between the X chip region 105 and the X clearance region 407 in the semiconductor wafer 400, the side surface portion of the dummy metal DM in a conductive layer located further outward in the –Z direction is more offset to the center of the corresponding light emitting element chip 373. The semiconductor wafer 400, therefore, does not require parts of the metal material to be removed by DRIE, and makes it possible to minimize the number of DRIE steps and the number of gases to be used for DRIE. Accordingly, the grooves sufficiently deep and wider toward their bottoms can be formed in the semiconductor wafer 400 with very high position accuracy close to the process rule. Since the light emitting element chips 373 manufactured based on the semiconductor wafer 400 are mounted on the print head 333, the print head 333 can drastically reduce the likelihood that part of the paste 74 goes up through the clearances between the light emitting element chips 373 to cover the light emitting thyristors LT. The print head 333 also makes it possible for the image forming apparatus 301 to form an image with a very high quality.

3. Third Embodiment

An image forming apparatus 501 (FIG. 1) according to a third embodiment is different from the image forming apparatus 1 according to the first embodiment in that the image forming apparatus 501 includes a print head 533 instead of the print head 33 (FIG. 2). In other respects, the image forming apparatus 501 has the same configuration as the image forming apparatus 1. The print head 533 is different from the print head 33 according to the first embodiment in that the print head 533 includes light emitting element chips 573 instead of the light emitting element chips 73 (FIG. 9). In other respects, the print head 533 has the same configuration as the print head 33.

Figure 20A:
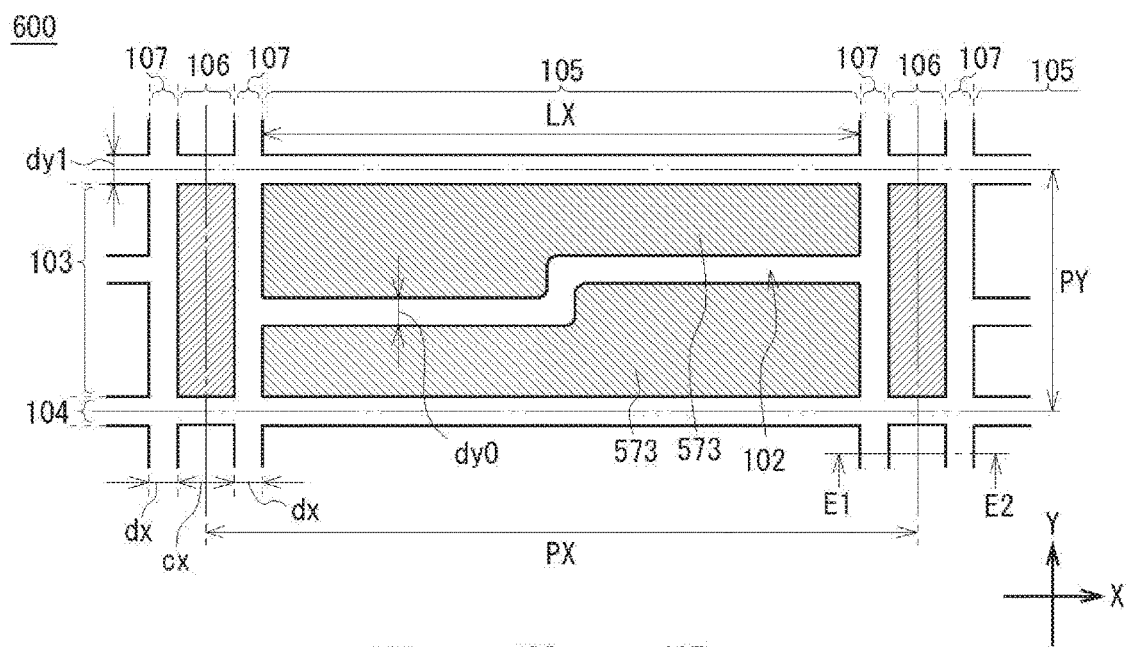
FIGS. 20A and 20B are schematic diagrams illustrating a configuration of a semiconductor wafer according to a third embodiment.
Figure 20B:
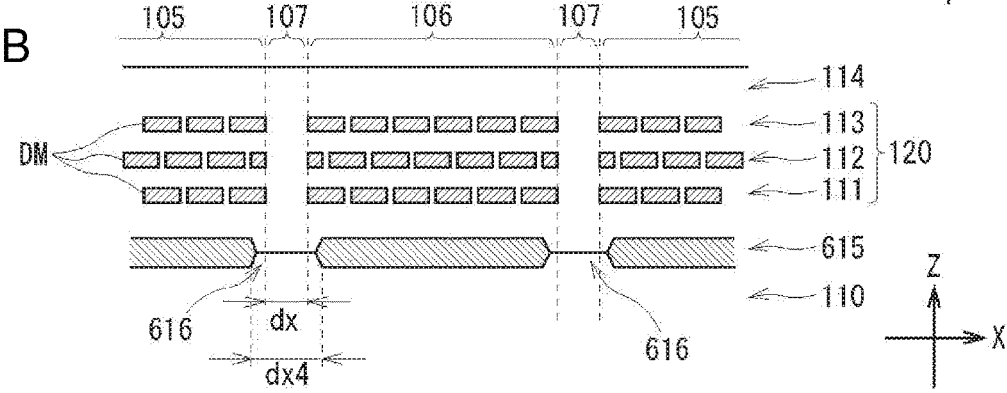

As illustrated in FIGS. 20A and 20B corresponding to FIGS. 13A and 13B, the light emitting element chips 573 are manufactured based on a semiconductor wafer 600 instead of the semiconductor wafer 100. Incidentally, FIG. 20B is a cross-sectional diagram of the semiconductor wafer 600 taken along the E1-E2 line of FIG. 20A. The semiconductor wafer 600 has substantially the same configuration as the semiconductor wafer 100. The semiconductor wafer 600, however, is different from the semiconductor wafer 100 in that the semiconductor wafer 600 is provided with a local oxidation of silicon (LOCOS) film 615 between the base layer 110 and the first conductive layer 111.

The LOCOS film 615 is an oxide film which is sufficiently thicker (that is to say, longer in the Z direction) than the conductive film 111 and the like. Furthermore, in the semiconductor wafer 600, LOCOS film gaps 616 where the LOCOS film 615 is omitted are formed in parts of the LOCOS film 615 which correspond to the X clearance regions 107.

In addition, in each boundary part between the X clearance region 107 and its neighboring X chip region 105, as well as in each boundary part between the X clearance region 107 and its neighboring X extra piece region 106, the LOCOS film gap 616 is formed such that the thickness of the LOCOS film 615 becomes smaller toward the X clearance region 107. Incidentally, the tapering part of the LOCOS film gap 616 is shaped like a "beak of a bird" as illustrated in FIG. 20B, and is called a "bird's beak portion."

The X-direction length of each LOCOS film gap 616 is a length dx4 which is greater than the length dx of the X clearance region 107. The semiconductor wafer 600, therefore, makes it possible to form sufficiently deep grooves, which penetrate through the LOCOS film gaps 616 in the –Z direction, by DRIE without switching the etching gas to a dedicated gas corresponding to the LOCOS film 615.

In other respects, too, the light emitting element chips 573, the print head 533 and the image forming apparatus 501 including them according to the third embodiment can bring about the same working and effects as the those according to the first embodiment.

In the third embodiment, with the above-discussed configuration, in manufacturing the light emitting element chips 573, the LOCOS film 615 is formed between the base layer 110 and the first conductive layer 111 in the semiconductor wafer 600, and the LOCOS film gaps 616 are formed in the parts of the semiconductor wafer 600 which correspond to the X clearance regions 107. The semiconductor wafer 600, therefore, does not require parts of the metal material or parts of the LOCOS film 615 to be removed by DRIE, and makes it possible to minimize the number of DRIE steps and the number of gases to be used for DRIE. Accordingly, the sufficiently deep grooves can be formed in the semiconductor wafer 600 with very high position accuracy close to the process rule. Since the light emitting element chips 573 manufactured based on the semiconductor wafer 600 are mounted on the print head 533, the print head 533 makes it possible for the image forming apparatus 501 to form an image with a very high quality.

4. Fourth Embodiment

An image forming apparatus 701 (FIG. 1) according to a fourth embodiment is different from the image forming apparatus 1 according to the first embodiment in that the image forming apparatus 701 includes a print head 733 instead of the print head 33 (FIG. 2). In other respects, the image forming apparatus 701 has the same configuration as the image forming apparatus 1. The print head 733 is different from the print head 33 according to the first embodiment in that the print head 733 includes light emitting element chips 773 instead of the light emitting element chips 73 (FIG. 9). In other respects, the print head 733 has the same configuration as the print head 33.

Figure 21A:
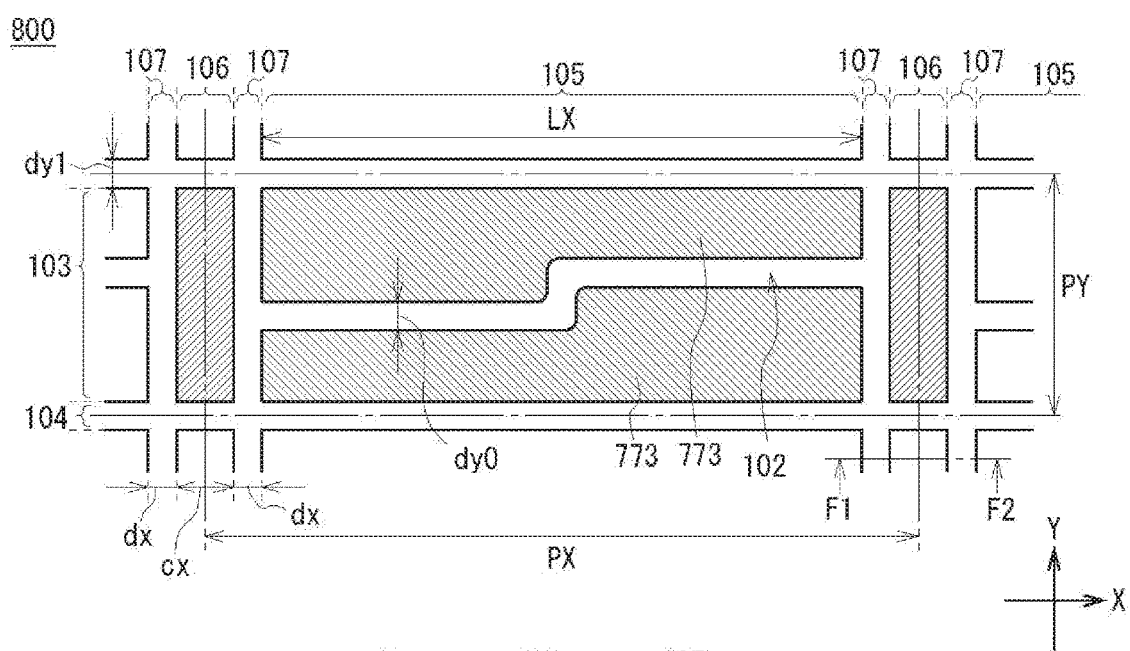
FIGS. 21A and 21B are schematic diagrams illustrating a configuration of a semiconductor wafer according to a fourth embodiment.
Figure 21B:
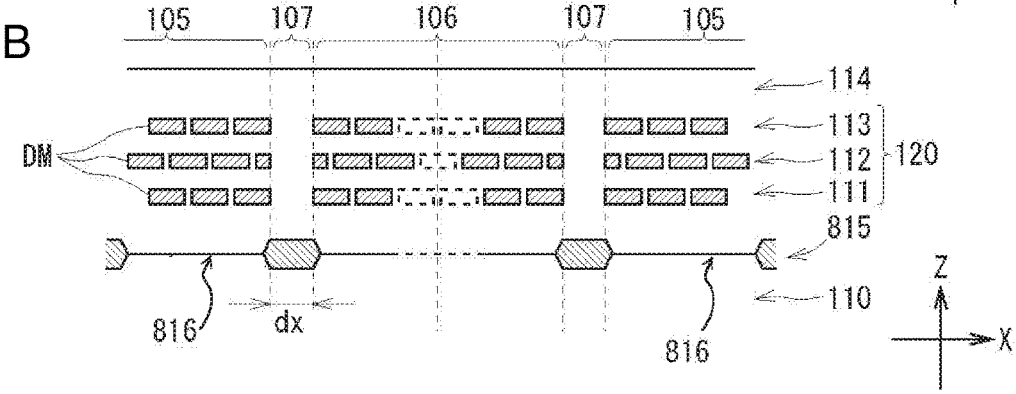

As illustrated in FIGS. 21A and 21B corresponding to FIGS. 13A and 13B, FIGS. 20A and 20B, and the like, the light emitting element chips 773 are manufactured based on a semiconductor wafer 800 instead of the semiconductor wafer 100. Incidentally, FIG. 21B is a cross-sectional diagram of the semiconductor wafer 800 taken along the F1-F2 line of FIG. 21A. The semiconductor wafer 800 has substantially the same configuration as the semiconductor wafer 100. The semiconductor wafer 800, however, is different from the semiconductor wafer 100 in that the semiconductor wafer 800 is provided with a LOCOS film 815 between the base layer 110 and the first conductive layer 111, like in the third embodiment.

Like the LOCOS film 615 according to the third embodiment, the LOCOS film 815 is an oxide film which is sufficiently thicker (that is to say, longer in the Z direction) than the conductive film 111 and the like. Unlike in the third embodiment, the LOCOS film 815 is formed in parts of the semiconductor wafer 800 which correspond to the X clearance regions 107, while LOCOS film gaps 816 where the LOCOS film 815 is omitted are formed in parts of the X chip regions 105 and the X extra piece regions 106 which correspond to areas where the dummy metals DM are arranged.

Incidentally, as for the light emitting element chips 773, the X-direction length of each X clearance region 107 is the length dx, while the X-direction length of each thicker portion (that is to say, each portion sufficiently long in the Z direction) of the LOCOS film 815 is similarly the length dx. As for the light emitting element chips 773, therefore, the X-direction length of each thicker portion of the LOCOS film 815 inclusive of the "bird's beak" portions is longer than the length dx.

Like in the semiconductor wafer 100 (FIGS. 13A to 13C and the like) according to the first embodiment, in the semiconductor wafer 800, the dummy metals DM are arranged in parts of the X chip regions 105 and the X extra piece regions 106 which are adjacent to the X clearance regions 107, while no dummy metal DM is formed in the X clearance regions 107. The semiconductor wafer 800, therefore, involves likelihood that: the upper surface of the semiconductor wafer 800 becomes lower in the X clearance regions 107 than in the rest of the semiconductor wafer 800; the upper surface thereof thus cannot obtain excellent flatness; and the epitaxial films 73F (FIG. 10 and the like) cannot be stably bonded to the upper surface thereof.

With this taken into consideration, instead of the dummy metals DM, the LOCOS film 815 is provided to the parts of the semiconductor wafer 800 which correspond to the X clearance regions 107. This makes it possible to prevent parts of the upper surface thereof from becoming lower than the rest of the upper surface, and accordingly to enhance the flatness of the upper surface.

Generally speaking, a LOCOS film is formed in a semiconductor wafer except for in areas where flip flops FF, gate driving circuit GD (FIG. 4) and the like are formed, that is to say, a LOCOS film is formed in parts of the semiconductor wafer where interconnect members (for example, aluminum or the like) for connecting transistor elements and the like are arranged. This prevents parasitic transistors from being formed under the interconnect members in the semiconductor wafer, that is to say, this prevents circuits in the diced light emitting element chips from working regardless of the design. In other words, a general semiconductor wafer is manufactured by: forming a base layer; partially forming a LOCOS film above the base layer; and forming conductive layers above them.

For this reason, the mask pattern shape and the like to be used for the general semiconductor wafer may be partially changed for the semiconductor wafer 800 according to this embodiment such that while producing the LOCOS film, the LOCOS film is formed in parts of the semiconductor wafer 800 which correspond to the X clearance regions 107, in addition to parts of the semiconductor wafer 800 which correspond to the interconnect members. In other words, the semiconductor wafer 800 requires no layer or film to be additionally formed by adding manufacturing steps to the steps which are performed to manufacture the general semiconductor wafer, the semiconductor wafer 100 according to the first embodiment, and so on. The semiconductor wafer 800, therefore, makes it possible to produce the LOCOS film 815 using a similar production process at similar costs.

Meanwhile, like the base layer 110 and the like as well as the insulating layers, the LOCOS film is made of a material mainly containing silicon. While DRIE (FIG. 14) discussed above is being performed, therefore, the sulfur fluoride gas ($SF_6$) used in the etching mode etches the surface of the LOCOS film although taking longer than to etch the base layer 110 and the like as well as the insulating layers.

The semiconductor wafer 800, therefore, enables parts of the LOCOS film 815 to be also etched to make the grooves in the −Z direction, by use of only the same sulfur fluoride gas ($SF_6$) as is used to etch the base layer 110 and the like as well as the insulating layers, without switching from the sulfur fluoride gas ($SF_6$) to another type of gas.

In other respects, too, the light emitting element chips 773, the print head 733 and the image forming apparatus 701 including them according to the fourth embodiment can bring about the same working and effects as the those according to the first embodiment.

In the fourth embodiment, with the above-discussed configuration, in manufacturing the light emitting element chips 773, the LOCOS film 815 is provided in parts of the semiconductor wafer 800 which correspond to the X clearance regions 107, in addition to parts thereof between the base layer 110 and the first conductive layer 111 where the interconnect members are formed. For this reason, the flatness of the surface of the semiconductor wafer 800 can be enhanced, and sufficiently deep grooves can be formed in the semiconductor wafer 800 by DRIE with very high position accuracy close to the process rule while minimizing the number of DRIE steps and the number of gases to be used for DRIE. Since the light emitting element chips 773 manufactured based on the semiconductor wafer 800 are mounted on the print head 733, the print head 733 makes it possible for the image forming apparatus 701 to form an image with a very high quality.

5. Fifth Embodiment

An image forming apparatus 901 (FIG. 1) according to a fifth embodiment is different from the image forming apparatus 1 according to the first embodiment in that the image forming apparatus 901 includes a print head 933 instead of the print head 33 (FIG. 2). In other respects, the image forming apparatus 901 has the same configuration as the image forming apparatus 1. The print head 933 is different from the print head 33 according to the first embodiment in that the print head 933 includes light emitting element chips 973 instead of the light emitting element chips 73 (FIG. 9). In other respects, the print head 933 has the same configuration as the print head 33.

Figure 22:
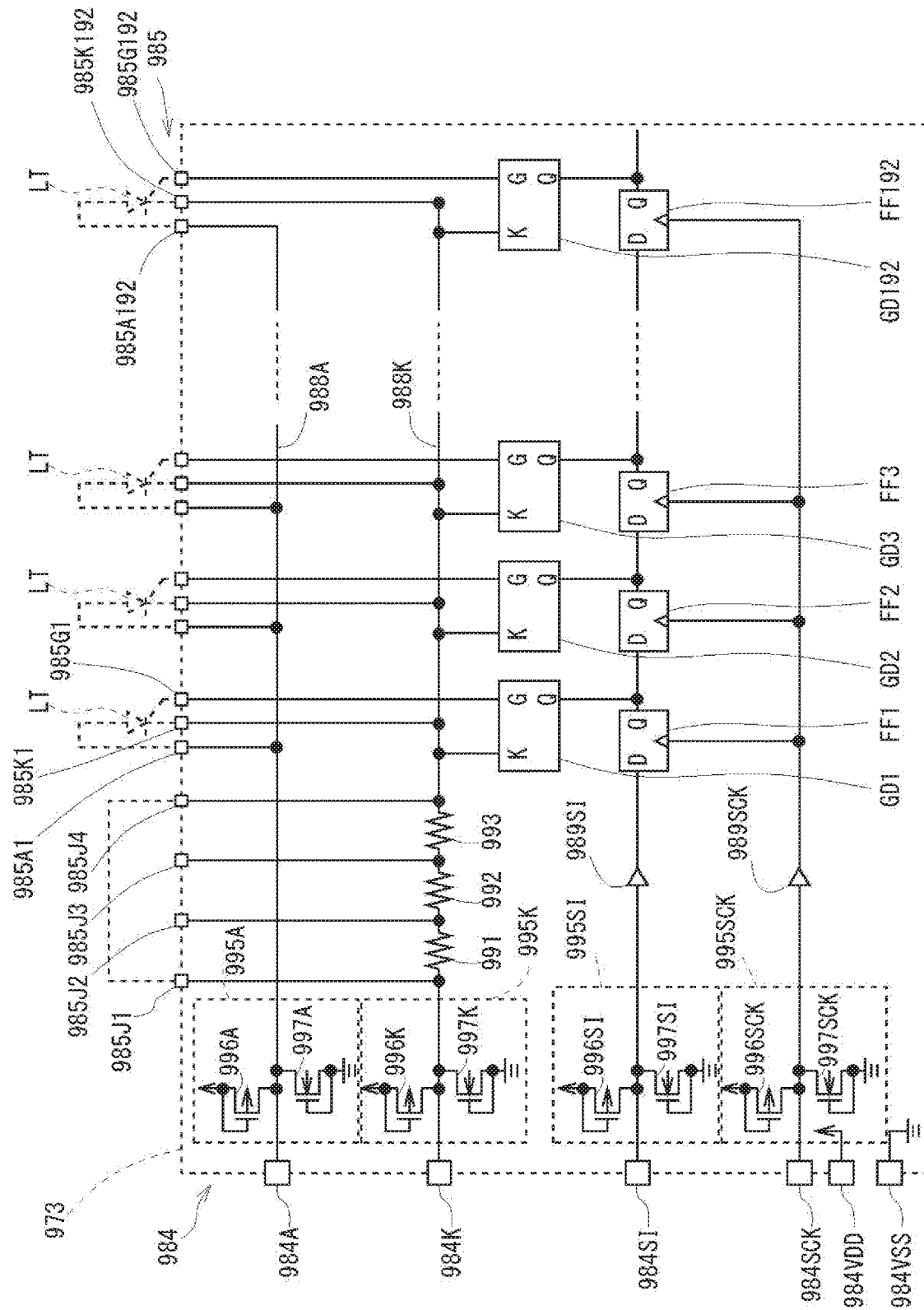
FIG. 22 is a schematic circuit diagram illustrating a circuit configuration of a light emitting element chip according to a fifth embodiment.

As illustrated in a circuit diagram of FIG. 22 corresponding to a part of the circuit diagram in FIG. 4, flip flops FF (FF1, FF2, . . . ), gate driving circuits GD (GD1, GD2, . . . ) and the like are connected together inside each light emitting element chip 973, like in the first embodiment. In addition, the light emitting element chip 973 is provided with an anode common bus 988A which is an interconnect to be connected to the anode terminals of the light emitting thyristors LT, and a cathode common bus 988K which is an interconnect to be connected to the cathode terminals of the light emitting thyristors LT, and the like.

The light emitting element chip 973 includes 6 terminal pads 984 (984A, 984K, 984SI, 984SCK, 984VDD and 984VSS), and micro vias 985 (985A1 to 985A192, 985K1 to 985K192, 985G1 to 985G192, 985J1 to 985J4). Incidentally, like on the light emitting element chip 73 (FIG. 12) according to the first embodiment, the terminal pads 984 and the micro vias 985 are arranged on parts of the surface of the light emitting element chip 973 which correspond to the terminal pads 84 and the micro via lines 85 on the surface of the light emitting element chip 73.

The terminal pads 984A are connected to the anode common bus 988A, while the terminal pads 984K are connected to the anode common bus 988K. In addition, resistors 991, 992, 993 are connected in series to a part of the cathode common bus 988K which is closer to the terminal pads 984 than the other part of the cathode common bus 988K to which the gate driving circuits GD are connected.

The terminal pad 984SI is connected to the input terminal D of the first-stage flip flop FF1 via a buffer 989SI. The terminal pad 984SCK is connected to the clock terminals of the respective flip flops FF via a buffer 989SCK. The terminal pad 984VDD is connected to the power supply terminals (not illustrated) of the respective elements, and the power supply circuit supplies the power supply voltage VDD to the terminal pad 984VDD. The terminal pad 984VSS is connected to the ground terminals (not illustrated) of the respective elements, and is connected to the ground terminal of the printed wiring board 72 (FIG. 10).

The micro vias 985A1 to 985A192 are connected to the anode terminals of the light emitting thyristors LT, respectively. The micro vias 985K1 to 985K192 are connected to the cathode terminals of the light emitting thyristors LT, respectively. The micro vias 985G1 to 985G192 are connected to the gate terminals of the light emitting thyristors LT, respectively.

Furthermore, the micro via 985J1 is connected to a terminal pad 984K side of the resistor 991; the micro via 985J2 is connected between the resistors 991, 992; the micro via 985J3 is connected between the resistors 992, 993; and the micro via 985J4 is connected to a gate driving circuit GD side of the resistor 993. Like in the first embodiment, an epitaxial film 73F (FIG. 10) is bonded to each light emitting element chip 73, and is thereafter subjected to predetermined measurement work and the like in a thin film wiring process. After that, depending on the necessity, the micro vias 985J1 to 985J4 are selectively connected together using predetermined jumper wirings. Thereby, in the light emitting element chip 973, a resistance value at a terminal pad 984K side of the cathode common bus 988K is adjusted.

Thereby, the print head 933 with the light emitting element chips 973 mounted thereon can realize excellent signal transmission with less signal reflection by matching a characteristic impedance value of a connection cable (not illustrated) which connects the print head 933 and the controller 3 (FIG. 3 and the like), as well as an equivalent impedance value between the print head 933 and the light emitting element chips 973.

Meanwhile, like in the first embodiment, the light emitting element chips 973, as arrayed on the semiconductor wafer 100 (FIG. 13), are manufactured by a processing process and the like. Thereafter, the epitaxial films 73F (FIG. 10) are respectively bonded to the light emitting element chips 973, and the micro vias 985 are connected to each light emitting element chip 973 by interconnects or the like depending on the necessity. Eventually, the light emitting element chips 973 are separated by dicing. The separated light emitting element chips 973 are mounted on the printed wiring board 72. Subsequently, wire bonding and other work are performed on the light emitting element chips 973. Through the wire bonding and other work, however, the light emitting element chips 973 are inevitably charged with static electricity.

In this respect, let us assume a case where: an object charged with a relatively large negative potential (for example, −100 volts) comes into contact with the terminal pad 984A; and a relatively large electric charge is supplied to the anode terminal of one light emitting thyristor LT via the anode common bus 988A. At this time, the light emitting thyristor LT is highly likely not to be in a light emitting condition. If not in the light emitting condition, the light emitting thyristor LT cannot discharge the supplied charge. This causes dielectric breakdown in the PN reverse connection inside the light emitting thyristor LT, for example, in the junction part between the N-type layer 63 and the P-type layer 62 in FIG. 6B, and leads to electrical malfunction.

With this taken into consideration, in each light emitting element chip 973 according to this embodiment, the interconnects (for example, the anode common bus 988A and the like) connected to the terminal pads 984A, 984K, 984SI, 984SCK are respectively provided with electrostatic discharge (ESD) protection members 995 (995A, 995K, 995SI, 995SCK). Incidentally, the ESD protection members 995K, 995SI, 995SCK each have the same configuration as the ESD protection member 995A. The following descriptions, therefore, are provided focusing on the ESD protection member 995A.

The ESD protection member 995A includes a PMOS transistor 996A and an NMOS transistor 997A. In other words, the ESD protection member 995A has a CMOS configuration. The source and gate terminals of the PMOS transistor 996A are connected to the power supply VDD, while the drain terminal of the PMOS transistor 996A is connected to the anode common bus 988A. The source and gate terminals of the NMOS transistor 997A are connected to the ground (that is to say, VSS), while the drain terminal of the NMOS transistor 997A is connected to the anode common bus 988A.

When a signal with a potential of 0 to 5 volts is supplied to the anode common bus 998A via the terminal pad 984A, both the PMOS transistor 996A and the NMOS transistor 997A of the ESD protection member 995A turn into the OFF state. The signal, therefore, exerts no influence on the operations of the light emitting thyristors LT and the like.

In contrast, if a signal with a relatively large negative potential (for example, −100 volts) is supplied to the anode common bus 998A via the terminal pad 984A, the NMOS transistor 997A of the ESD protection member 995A turns into the ON state, and the ESD protection member 995A can make an electric current flow from the drain terminal to the source terminal, namely the ground. On this occasion, in the light emitting element chip 973, a threshold voltage at the NMOS transistor 997A is typically approximately 0.5 volts. The ESD protection member 995A, therefore, can hold a voltage to be applied to the anode terminals of the respective light emitting thyristors LT connected to the anode common bus 998A, at approximately −0.5 volts.

Furthermore, if a signal with a relatively large positive potential (for example, 100 volts) is supplied to the anode common bus 998A via the terminal pad 984A, the PMOS transistor 996A of the ESD protection member 995A turns into the ON state, and the ESD protection member 995A can make an electric current flow from the drain terminal to the source terminal, namely the power supply VDD. On this occasion, in the light emitting element chip 973, a threshold voltage at the PMOS transistor 996A is typically approximately 0.5 volts. The ESD protection member 995A, therefore, can hold a voltage to be applied to the anode terminals of the respective light emitting thyristors LT connected to the anode common bus 998A, at approximately 0.5 volts.

In this respect, in the light emitting element chip 973, a parasitic circuit (not illustrated) having a predetermined impedance component is formed between the power supply VDD and VSS due to the circuit patterns and the like formed inside the light emitting element chip 973. Using this parasitic circuit, therefore, the light emitting element chip 973 can discharge the relatively large positive potential supplied to the power supply VDD, and the relatively large negative potential supplied to the ground VSS.

Moreover, since in each light emitting element chip 973, the PMOS transistors 996 and the NMOS transistors 997 of the respective ESD protection members 995 are CMOSs, the PMOS transistors 996 and the NMOS transistors 997 can be produced in parallel with the flip flops FF and the gate driving circuits GD while the semiconductor wafer is being manufactured using exposure techniques, etching techniques and the like. The light emitting element chip 973 requires no additional step of packaging the ESD protection members 995 alone. In addition, the light emitting element chip 973 theoretically makes it possible to avoid a problem which would occur if the elements of each ESD protection member 995 were packaged afterward, that is to say, a problem that the light emitting thyristors LT would not be able to be protected from static electricity and the like until the elements thereof are packaged.

In other respects, too, the light emitting element chips 973, the print head 933 and the image forming apparatus 901 including them according to the fifth embodiment can bring about the same working and effects as the those according to the first embodiment.

In the fifth embodiment, with the above-discussed configuration, each light emitting element chip 973 is provided with the ESD protection member 995A and the like. Even if, therefore, an object charged with a relatively large positive or negative potential comes into contact with the terminal pad 984A or the like on any light emitting element chip 973 during the steps of manufacturing the print head 933, the ESD protection member 995A and the like can discharge the potential to the power supply VDD or the ground (VSS), and accordingly can protect the light emitting thyristors LT from being broken. The print head 933 with the light emitting element chips 973 mounted thereon, therefore, makes it possible for the image forming apparatus 901 to form an image with a very high quality.

6. Other Embodiments

The foregoing first embodiment has discussed the case where in each boundary part between the X chip region 105 and the X clearance region 107, as well as in each boundary part between the X extra piece region 106 and the X clearance region 107, the X-direction positions of the side surfaces of the dummy metals DM are aligned with one another among the semiconductor layers 120 (FIG. 13B). The invention, however, is not limited to this case. For example, the X-direction positions of the side surfaces of the dummy metals DM may be staggered among the semiconductor layers 120. In this example case, no dummy metals DM may be arranged at least in the X clearance regions 107. This is also the case with the third to fifth embodiments.

The foregoing first embodiment has further discussed the case where the grooves of the chip pair clearances 102, the Y clearance regions 104 and the X clearance regions 107 are formed in the semiconductor wafer 100 at the same time by applying DRIE to the semiconductor wafer 100. The invention, however, is not limited to this case. For example, the grooves of the chip pair clearances 102 and the Y clearance regions 104, as well as the grooves of the X clearance regions 107 may be respectively formed in different steps. This is also the case with the second to fifth embodiments.

Figure 23A:
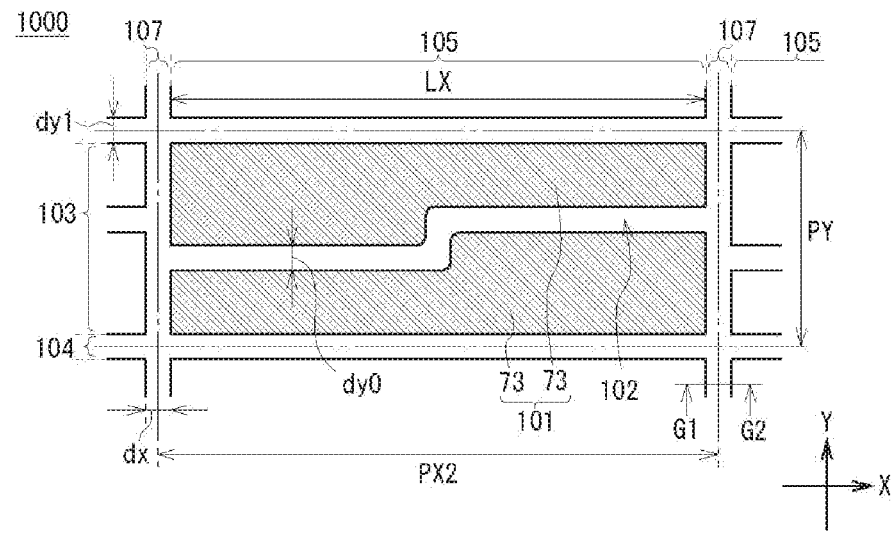
FIGS. 23A to 23C are schematic diagrams illustrating a configuration of a semiconductor wafer according to another embodiment.
Figure 23B:
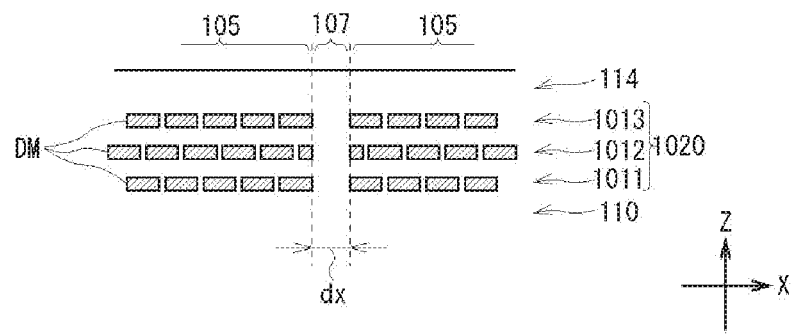
Figure 23C:
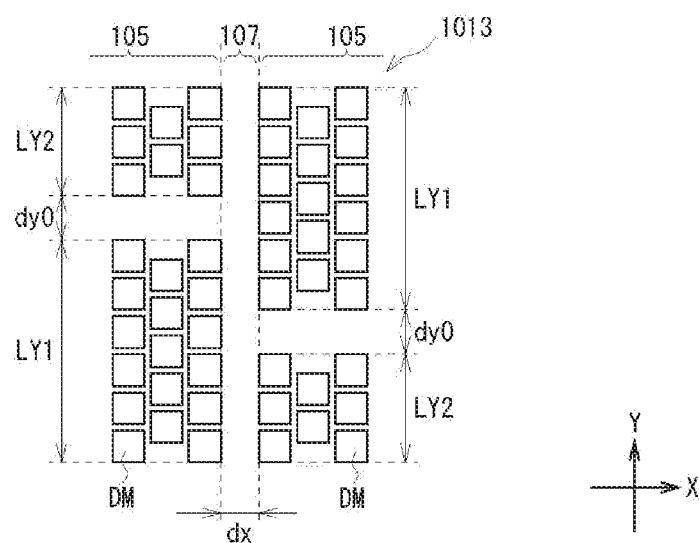

The foregoing first embodiment has further discussed the case where the X extra piece regions 106 are provided in the semiconductor wafer 100 at intervals in the X direction (FIG. 13A). The invention, however, is not limited to this case. For example, the X extra piece regions 106 may be omitted like in a semiconductor wafer 1000 illustrated in FIGS. 23A, 23B and 23C corresponding to 13A, 13B and 13C. Incidentally, FIG. 23B is a cross-sectional diagram of the semiconductor wafer 1000 taken along the G1-G2 line of FIG. 23A. In other words, the X clearance regions 107 may be arranged between the X chip regions 105 arrayed in the X direction. This arrangement makes it possible to increase the number of light emitting element chips 73 manufacturable from a single semiconductor wafer. This is also the case with the second and third embodiments.

The foregoing first embodiment has further discussed the case where one long side of each light emitting element chip 73 is curved in the shape of a crank (FIG. 12, FIG. 13 and the like). The invention, however, is not limited to this case. For example, the two long sides of each light emitting element chip 73 may extend in a straight line. Otherwise, an arbitrary side of the light emitting element chip 73 may be curved in the shape of a crank. In the example cases, no dummy metal DM may be arranged in the parts where the grooves are formed by DRIE. This is also the case with the second to fifth embodiments.

The foregoing first embodiment has further discussed the case where the dummy metals DM arranged in the semiconductor layers 120 are substantially equal in size to one another. The invention, however, is not limited to this case. For example, the size of the dummy metals DM may be made different from one conductive layer 120 to another. Otherwise, the dummy metals DM in different sizes may be arranged in the same conductive layer 120. This is also the case with the second to fifth embodiments.

The foregoing first embodiment has further discussed the case where the dummy metals DM are arranged in all the conductive layers 120. The invention, however, is not limited to this case. For example, the dummy metals DM may be arranged in only some of the conductive layers 120. This is also the case with the second to fifth embodiments.

The foregoing first embodiment has further discussed the case where the number of conductive layers 120 is three. The invention, however, is not limited to this case. For example, the number of conductive layers 120 may be two or less, or four or more.

In addition, the foregoing fourth embodiment has discussed the case where: the X-direction length of each relatively thick portion of the LOCOS film 815 is equal to the length dx of the X clearance regions 107; and the X-direction length of the combination of the relatively thick portion and the bird's beak portions is longer than the length dx (FIGS. 21A and 21B). The invention, however, is not limited to this case. For example, the X-direction length of each relatively thick portion of the LOCOS film 815 may be equal to such different values that the X-direction length of the combination of the relatively thick portion and the bird's beak portions may be equal to the length dx. In the example case, it is desirable that the X-direction length of each portion of the LOCOS film 815 be adjusted so as to enhance the flatness of the upper surface of the semiconductor wafer 800.

Figure 24:
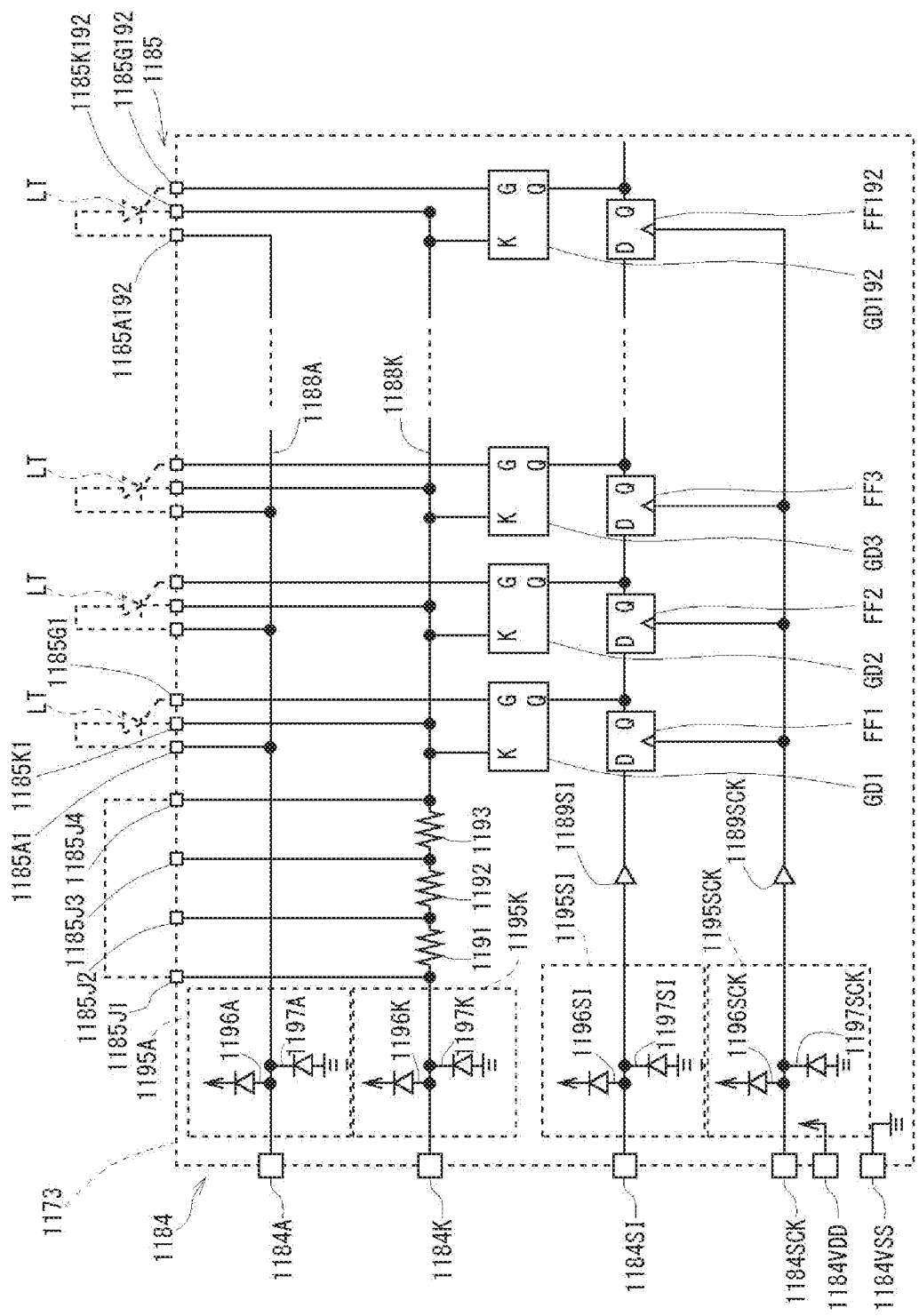
FIG. 24 is a schematic circuit diagram illustrating a circuit configuration of a light emitting element chip according to another embodiment.

Moreover, the foregoing fifth embodiment has discussed the case where the ESD protection member 995A includes the PMOS transistor 996A and the NMOS 997A (FIG. 22). The invention, however, is not limited to this case. For example, like in a light emitting element chip 1173 illustrated in FIG. 24 corresponding to FIG. 22, an ESD protection member 1195A may include various elements such as diodes 1196A, 1197A. The essential point is that the ESD protection member 1195A can protect the light emitting thyristors LT such that: when a signal with a potential of 0 to 5 volts is supplied to an anode terminal 1184A and the like, the ESD protection member 1195A allows the signal to flow through the ESD protection member 1195A; and when a relatively large positive or negative voltage is applied to the anode terminal 1184A and the like, the ESD protection member discharges the voltage to the power supply VDD or the ground (VSS). This is also the case with the ESD protection members 995K, 995SI, 995SCK.

The foregoing first embodiment has further discussed the case where: the controller 3 makes the light emitting thyristors LT of the light emitting element chips 73 emit light to form an electrostatic latent image on the circumferential side surface of the photosensitive drum 38 (FIG. 2); and eventually, a toner image is transferred onto a sheet P (FIG. 1) to form an image thereon. The invention, however, is not limited to this case. For example, the invention is applicable to a case where driving circuits drive driven elements arranged in a line or in a matrix in a head unit installed in various printers which form an image using various methods, such as a printer with an organic electro-luminescence (EL) head including an organic EL element array, and a thermal printer including arrayed heating resistors. This is also the case with the second to fifth embodiments.

The foregoing first embodiment has further discussed the case where the invention is applied to the image forming apparatus 1 as a MFP. The invention, however, is not limited to this case. For example, the invention is applicable to various electronic devices, such as copy machines and facsimile machines, which have a function of forming a toner image and fixing the toner image onto a sheet using electrophotography. This is also the case with the second to fifth embodiments.

The foregoing first embodiment has further discussed the case where the invention is applied to the case in which the light emitting element chips 73 that emit light are manufactured based on the semiconductor wafer 100. The invention, however, is not limited to this case. For example, the invention is applicable to a case where element chips having various functions, such as an image pickup element (for example, a contact image sensor (CIS)), which receives light and generates an electrical signal depending on an amount of received light, are manufactured based on a semiconductor wafer. This is also the case with the second to fifth embodiments.

What is more, the invention is not limited to the foregoing embodiments and the other foregoing embodiments. In other words, the scope of the application of the invention covers embodiments obtained by arbitrarily combining parts or all of the foregoing embodiments and the other foregoing embodiments, as well as embodiments obtaining by extracting parts from the foregoing embodiments and the other foregoing embodiments.

The foregoing first embodiment has further discussed the case where as the driven element chips, the light emitting element chip 73 each include the chip substrate 73B as the chip substrate, the light emitting element group 81 as the driven element group, the conductive layers 120 as the conductive layers, and the dummy metals DM as the dummy conductors. The invention, however, is not limited to this case. The driven element chips each may include a chip substrate having a different configuration, a driven element group having a different configuration, conductive layers each having a different configuration, and dummy metals each having a different configuration.

The invention is usable, for example, for MFPs which forms a toner image and fixes the toner image into a sheet using electrophotography.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:
1. A driven element chip comprising:
a chip substrate including an arrangement surface extending in a plane substantially orthogonal to a depth direction of the chip substrate and side surfaces defining an outline of the arrangement surface and extending in a direction crossing the plane;
a driven element group provided on the arrangement surface, and including driven elements arrayed in an array direction;
a conductive layer arranged substantially parallel to the arrangement surface at a depth inside the chip substrate, and including interconnect portions electrically connected to the driven elements or components that drive the driven elements; and
a dummy conductor arranged in a part of the conductive layer where the interconnect portions are not arranged in a view along a direction orthogonal to the arrangement surface, wherein
one of the side surfaces of the chip substrate that is provided on a side of the arrangement surface in the array direction, which is a chip substrate side surface, comprises an etched surface at least in an area where the conductive layer is provided,
the conductive layer comprises a plurality of conductive layers at different depths in the chip substrate and the dummy conductor comprises a plurality of dummy conductors respectively provided in the plurality of the conductive layers, and the dummy conductors at the different depths respectively include side surfaces that are arranged at and exposed from the chip substrate side surface such that the side surface of one of the dummy conductors, which is arranged at a first distance from the arrangement surface in the depth direction, is offset toward a center of the driven element chip, along a direction parallel to the arrangement surface, from the side surface of another of the dummy conductors, which is arranged at a second distance nearer to the arrangement surface in the depth direction than the first distance.

2. The driven element chip according to claim 1, wherein in the chip substrate, a base layer is provided on an opposite side of a set of the plurality of conductive layers from the arrangement surface, and a LOCOS film is formed in a part of the chip substrate which is between the set of the plurality of conductive layers and the base layer in the depth direction.

3. The driven element chip according to claim 1, wherein the driven elements are provided to an element film bonded to the arrangement surface of the chip substrate.

4. The driven element chip according to claim 1, wherein interconnects electrically connected to the driven elements are respectively provided with protection members which protect the driven elements.

5. An exposing device comprising:

the driven element chips according to claim 1; and a substrate on which the driven element chips are mounted in an array in a main scanning direction, wherein the driven elements provided to the driven element chips are light emitting elements.

6. An image forming apparatus comprising:

the exposing device according to claim 5; and a controller which supplies a signal to the exposing device depending on an image to be formed.

7. The driven element chip according to claim 1, wherein the dummy conductor is provided at an outer edge portion of the chip substrate.

8. The driven element chip according to claim 1, wherein the dummy conductor is provided at least at each of both longitudinal end portions of the chip substrate.

9. The driven element chip according to claim 1, wherein the chip substrate side surface comprises the etched surface over a substantially entire of the chip substrate side surface.

10. A driven element chip comprising:

a chip substrate including an arrangement surface extending in a plane substantially orthogonal to a depth direction of the chip substrate and side surfaces defining an outline of the arrangement surface and extending in a direction crossing the plane;

a driven element group provided on the arrangement surface, and including driven elements arrayed in an array direction;

a conductive layer arranged substantially parallel to the arrangement surface at a depth inside the chip substrate, and including interconnect portions electrically connected to the driven elements or components that drive the driven elements; and a dummy conductor arranged in a part of the conductive layer where the interconnect portions are not arranged in a view along a direction orthogonal to the arrangement surface, wherein one of the side surfaces of the chip substrate that is provided on a side of the arrangement surface in the array direction, which is a chip substrate side surface, comprises an etched surface at least in an area where the conductive layer is provided, the conductive layer comprises a plurality of conductive layers at different depths in the chip substrate and the dummy conductor comprises a plurality of dummy conductors respectively provided in the plurality of the conductive layers, and the dummy conductors at the different depths respectively include side surfaces that are arranged at and exposed from the chip substrate side surface such that the exposed side surface of the dummy conductor at a first depth is offset toward a center of the driven element chip, along a direction parallel to the arrangement surface, from the exposed side surface of the dummy conductor at a second depth that is adjacent to and arranged nearer to the arrangement surface than the first depth in the depth direction, and the exposed side surface of the dummy conductor at the second depth is offset toward the center of the driven element chip, along the direction parallel to the arrangement surface, from the exposed side surface of the dummy conductor at a third depth that is adjacent to and arranged nearer to the arrangement surface than the second depth in the depth direction.

* * * * *